(12) United States Patent
Akahori et al.

(10) Patent No.: US 6,443,165 B1
(45) Date of Patent: Sep. 3, 2002

(54) METHOD FOR CLEANING PLASMA TREATMENT DEVICE AND PLASMA TREATMENT SYSTEM

(75) Inventors: Takashi Akahori, Hachioji; Masaki Tozawa, Fussa; Yoko Naito; Risa Nakase, both of Sagamihara; Shuichi Ishizuka, Tsukui-Gun; Masahide Saito, Setagaya-Ku; Tadashi Hirata, Sagamihara, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/101,554

(22) PCT Filed: Nov. 13, 1997

(86) PCT No.: PCT/JP97/04145

§ 371 (c)(1),
(2), (4) Date: Sep. 21, 1998

(87) PCT Pub. No.: WO98/21749

PCT Pub. Date: May 22, 1998

(30) Foreign Application Priority Data

Nov. 14, 1996 (JP) .............................................. 8-320910
Nov. 14, 1996 (JP) .............................................. 8-320914

(51) Int. Cl.⁷ ................................................. B08B 6/00
(52) U.S. Cl. ........................... 134/1.1; 216/67; 427/534
(58) Field of Search ................................ 427/534, 535, 427/577, 249.1; 134/1.1, 1.2; 156/345; 216/67, 75

(56) References Cited

U.S. PATENT DOCUMENTS

| | | | |
|---|---|---|---|
| 5,176,791 A | | 1/1993 | Itoh et al. |
| 5,198,263 A | * | 3/1993 | Stafford et al. .............. 427/577 |
| 5,211,825 A | * | 5/1993 | Saito et al. ............ 204/192.32 |
| 5,417,826 A | | 5/1995 | Blalock |
| 5,425,842 A | * | 6/1995 | Zijlstra ........................ 438/761 |
| 5,674,638 A | * | 10/1997 | Grill et al. ............. 428/694 TC |
| 5,814,155 A | * | 9/1998 | Solis et al. ..................... 134/1 |
| 5,855,725 A | * | 1/1999 | Sakai .......................... 156/345 |
| 5,858,819 A | * | 1/1999 | Miyasaka ................... 438/149 |
| 5,911,835 A | * | 6/1999 | Lee et al. ..................... 134/1.3 |
| 5,935,340 A | * | 8/1999 | Xia et al. ..................... 134/1.1 |
| 6,010,967 A | * | 1/2000 | Donohoe et al. ............ 134/1.1 |

FOREIGN PATENT DOCUMENTS

| | | |
|---|---|---|
| EP | 0 305 946 | 3/1989 |
| EP | 0 701 283 | 3/1996 |
| JP | 61-218134 | 9/1986 |
| JP | 62-43335 | 12/1987 |
| JP | 63-5532 | 1/1988 |
| JP | 63-233549 | 9/1988 |
| JP | 2-174229 | 7/1990 |
| JP | 3-3380 | 1/1991 |
| JP | 4-271122 | 9/1992 |
| JP | 6-53193 | 2/1994 |
| JP | 4-196421 | 7/1994 |
| JP | 8-22981 | 1/1996 |
| JP | 8-97185 | 4/1996 |
| JP | 8-225936 | 9/1996 |

OTHER PUBLICATIONS

S. Takeishi, et al., "Fluorocarbon Films Deposited by PECVD with High Thermal Resistance and Low Dielectric Constants". Dumic Conference Feb. 20–21, 1996 pp. 71–77.
K. Endo, et al., "Effect of Bias Addition on the Gap–Filling Properties of Fluorinated Amorphous Carbon Thin Films Grown by Helicon Wave Plasma Enhanced Chemical Vapor Deposition". Extended Abstracts of the 1996 International Conference on Solid State Materials, Yokohama, 1996 pp. 818–820.
Endo et al., "Flourinated amorphous carbon thin films grown by helicon plasma enhanced chemical vapor deposition for low dielectric constant interlayer dielectrics", Applied Physics Letters, vol. 68, No. 20, May 13, 1996, pp. 2864–2866.
Matsubara et al., "Low–k Fluorinated Amorphous Carbon Interlayer Technology for Quarter Micron Devices", IEEE International Electron Devices Meeting, (1996) pp. 369–372.

* cited by examiner

*Primary Examiner*—Bret Chen
(74) *Attorney, Agent, or Firm*—Smith, Gambrell & Russell, LLP

(57) ABSTRACT

A method for use in a plasma treatment system that shortens the time required for the cleaning of a fluorine containing carbon film adheared in a vacuum vessel and protects the surface of a transfer table when the cleaning is carried out. After a CF film is deposited by, e.g., a plasma treatment system, the cleaning of the CF film adhered in a vacuum vessel 2 is carried out. In the cleaning, a plasma of $O_2$ gas is produced, and the C—C and C—F bonds on the surface of the CF film are physically and chemically cut by the active species of O produced by the plasma. The $O_2$ gas penetrates into the CF film at places where the C—C and C—F bonds have been cut, to react with C of the CF film to form $CO_2$ which scatters. On the other hand, F scatters as $F_2$. Thus, the CF film is removed.

3 Claims, 23 Drawing Sheets

| MICRO WAVE POWER DENSITY (kw/m$^3$) | CLEANING TIME (min) |
|---|---|
| 6 | 60 |
| 9 | 50 |
| 10 | 40 |
| 11 | 37 |
| 12.5 | 35 |

FIG.3 (a)

| MICRO WAVE POWER DENSITY (kw/m$^3$) | CLEANING TIME (min) |
|---|---|
| 6 | 20 |
| 10 | 15 |

FIG.3 (b)

| PRESSURE (Pa) | MAG-NETIC FIELD | CLEANING TIME ( min ) ||
|---|---|---|---|
| | | SURROUNDING PORTION OF GAS SUPPLY OPENING | SURROUND-ING PORTION OF TRANS-FER TABLE |
| 0.2 | MIRROR | 5 | 60 or more |
| | DI-VERGENT | 10 | 30 |
| 20 | MIRROR | 10 | 60 or more |
| | DI-VERGENT | 12 | 50 |

FIG.5

| CLEANING GAS | CLEANING TIME |
|---|---|
| $O_2$ | 60 min or more |
| $O_2 + H_2$ | 50 min |
| $O_2 + CF_4$ | 50 min |
| $O_2 + NF_3$ | 30 min |

FIG.7 (a)

| CLEANING GAS | CLEANING TIME |
|---|---|
| $O_2$ ↓ $NF_3$ | 30 min ($O_2$ 5 min, $NF_3$ 25 min) |
| $O_2$ ↓ $NF_3 + N_2$ | 30 min ($O_2$ 5 min, $NF_3 + N_2$ 25 min) |

FIG.7 (b)

| CLEANING GAS | CLEANING TIME (min) | |
|---|---|---|
| | SURROUNDING PORTION OF GAS SUPPLY OPENING | SURROUNDING PORTION OF TRANSFER TABLE |
| $CO_2$ GAS | 3.5 | 29 |
| $N_2O$ GAS | 3 | 25 |
| $N_4O_2$ GAS | 2 | 17 |
| CO GAS | 1.5 | 15 |
| $O_2$ GAS | 5 | 35 |

FIG.13

| | | CLEANING WAFER | NO CLEANING WAFER |
|---|---|---|---|
| WAFER TEMPERATURE | MAXIMUM | 238°C | 341°C |
| | MINIMUM | 217°C | 218°C |
| | MAXIMUM/ MINIMUM | 4.6% | 22.0% |
| THICKNESS | MAXIMUM | 10554 Å | 10598 Å |
| | MINIMUM | 10305 Å | 10012 Å |
| | MAXIMUM/ MINIMUM | 1.2% | 2.8% |

FIG.14

INNER WALL SURFACE
OF VACUUM VESSEL

METHOD FOR CLEANING PLASMA TREATMENT DEVICE AND PLASMA TREATMENT SYSTEM

TECHNICAL FIELD

The present invention relates generally to a method for cleaning a plasma treatment system for carrying out the plasma treatment of a substrate to be treated, such as a semiconductor wafer, and a plasma treatment system.

BACKGROUND ART

Typically, an interconnection layer of aluminum is used as a metallization pattern of an integrated circuit, and an $SiO_2$ or SiOF film is used as an interlayer insulator film for insulating the interconnection layer. As a method for depositing these layer and films, there is a tendency to use, e.g., the ECR (Electron Cyclotron Resonance) plasma treatment, which utilizes the combination of a microwave with a magnetic field, since the quality of films deposited by the method is good.

FIG. 28 shows an example of a plasma treatment system for carrying out the ECR plasma treatment. A microwave of, e.g., 2.45 GHz, is supplied into a plasma production chamber 1A via a waveguide 11. Simultaneously, a magnetic field of a predetermined magnitude, e.g., 875 gausses, is applied into the plasma production chamber 1A by means of an electromagnetic coil 121. Thus, the interaction (resonance) between the microwave and the magnetic field produces a plasma of a plasma gas, such as Ar or $O_2$ gas, and a plasma of a reactive gas, such as $SiH_4$ gas, which is introduced into a thin film deposition chamber 1B. These plasmas form an active species of $SiH_4$ gas to deposit a thin film on the surface of a semiconductor wafer W transferred onto a transfer table 13 of AlN (aluminum nitride).

In such a plasma treatment system, when the deposition treatment of an $SiO_2$ film and so forth is carried out, these films are adhered to the side wall of the thin film deposition chamber 1B and the surrounding portion of the transfer table 13. When the thin film deposition treatment proceeds to allow the film to have a certain thickness, the adhered film is peeled off to cause particles. Therefore, after the deposition treatment of the $SiO_2$ or SiOF film is carried out, a predetermined cleaning is carried out to remove the adhered film.

For example, the cleaning for removing the $SiO_2$ or SiOF film is carried out for, e.g., about 20 minutes, each time the deposition on, e.g., 12 wafers W, is carried out. As a cleaning gas, a F containing gas, such as $CF_4$ or $NF_3$ gas, is introduced into a vacuum vessel, and this gas is activated by a plasma to allow the active species to react with the adhered film to remove the adhered film.

After the cleaning is completed, a predetermined precoat is carried out in order to prevent particles remaining on the inner wall of the vacuum vessel 10 from scattering and so forth. This precoat is a treatment for depositing a precoat film on the inner wall of the vacuum vessel 10. For example, in the case of the deposition treatment of an $SiO_2$ film or the like, the precoat film is formed of an $SiO_2$ or $SiF_4$ film.

By the way, the $SiO_2$ film has a dielectric constant of about 4, and the SiOF film has a dielectric constant of about 3.5. In recent years, a demand for higher speed devices has been raised, so that a demand for interlayer insulator films having a low dielectric constant has been made. Therefore, as such an interlayer insulator film having a low dielectric constant, a fluorine containing carbon film (which will be hereinafter referred to as a "CF film") capable of having a dielectric constant of 2.5 or less has been widely noticed.

This CF film can be also deposited by the above described plasma treatment system. However, if the F containing gas, such as $CF_4$ or $NF_3$ gas, is used to carry out the cleaning of the CF film, the cleaning hardly progresses when only $CF_4$ gas is used. In addition, when only $NF_3$ gas is used, the cleaning rate is very slow, and the treatment takes a long time, about 90 minutes. Thus, if the cleaning takes a long time, there is a problem in that the throughput in the thin film deposition treatment deteriorates since the cleaning is carried out during the thin film deposition treatment.

In addition, when the cleaning is carried out, the transfer table 13 is exposed to plasma. However, since the CF film is not originally adhered to the surface of the transfer table 13, the surface of the transfer table 13 is directly struck with plasma to become rough. Thus, when the surface of the transfer table 13 becomes rough, the surface of the transfer table has irregularities, so that the absorbing force onto the wafer W and the thermal conduction into the wafer Ware partially changed. In addition, the thin film deposition treatment changes between the initial and later stages of the process, so that the reproducibility of the process deteriorates. Therefore, there is a problem in that the inplane uniformity of the thickness of the deposited film deteriorates or the face-to-face uniformity of the thickness thereof deteriorates.

Moreover, if the surface of the transfer table 13 becomes rough, there are also problems in that the rough surface of the transfer table 13 may cause particles when the wafer W is loaded onto the transfer table 13 to carry out the subsequent thin film deposition treatment or unloaded from the transfer table 13, and that the life of the expensive transfer table 13 may be reduced. For example, when a particularly strong plasma is intended to be produced to increase the cleaning rate, there is a problem in that the surface of the transfer table deteriorates considerably.

In addition, when the cleaning is carried out, an operator observes the interior of the thin film deposition chamber 1B via a peep hole 14, which is formed in the side wall of the thin film deposition chamber 1B, to determine the finish time of the treatment by recognizing whether the film remains. According to such a method, the determination of the finish time may be incorrect since it is relied upon the experience of the operator. Consequently, there are problems in that the determined finish time is too early so that the film remains, and that in order to prevent the determination of the early finish time, the determined finish time is late so that the cleaning time is too long, thereby reducing the throughput in the thin film deposition treatment.

It is therefore an object of the present invention to eliminate the aforementioned problems and to provide a method for cleaning a plasma treatment system, which can shorten the time required for the cleaning of a fluorine containing carbon film adhered in a vacuum vessel. It is another object of the present invention to provide a method for cleaning a plasma treatment system, which can protect a transfer table when the cleaning of an adhered film is carried out.

In addition, the CF film can be also deposited by means of the above described plasma treatment system. However, if the precoat film is formed of an $SiO_2$ or SiOF film when the deposition treatment of the CF film is carried out, there is a problem in that the precoat film is easy to react with a raw material gas of the CF film, e.g., a CF gas, such as $C_4F_8$ gas, to produce particles, and the precoat used for the deposition treatment of the CF film has many unknown components.

It is therefore another object of the present invention to provide a plasma treatment method, which can carry out a stable thin film deposition on a substrate to be treated, by reducing particles in a vacuum vessel.

DISCLOSURE OF THE INVENTION

According to the present invention, a plasma treatment system cleaning method comprises: a thin film deposition step of transferring a substrate to be treated, onto a transfer table provided in a vacuum vessel, and producing a plasma of a thin film deposition gas to deposit a fluorine containing carbon film on the substrate by means of the plasma of the thin film deposition gas; and a cleaning step of producing a plasma of an oxygen plasma producing gas in the vacuum vessel, and removing the fluorine containing carbon film adhered in the vacuum vessel, by means of the plasma of the oxygen plasma producing gas. The plasma production of the thin film deposition gas may be carried out by producing the plasma of the thin film deposition gas by the interaction between a microwave and a magnetic field. In this case, the electric power of the microwave per unit volume (1 cubic meter) of the vacuum vessel is preferably set to be 10 kW or more.

Alternatively, the plasma production of the thin film deposition gas may be carried out by forming a magnetic field by a magnetic field forming means so that a line of magnetic force runs from a region, which faces a surface to be treated of a substrate to be treated, toward the substrate, and by producing a plasma of the thin film deposition gas on the basis of the interaction between an electric field and the magnetic field. In this case, the cleaning step is preferably carried out while adjusting the magnetic field so that the line of magnetic force near the substrate is more divergent than that in the thin film treatment step. Moreover, in this case, the magnetic field forming means may comprise a first coil, which is wound so as to surround a central axis of the substrate and which is provided above the substrate, and a second coil, which is wound so as to surround a central axis of the substrate and which is provided on a side of the substrate or below the substrate. The magnetic field adjustment is preferably carried out by causing a current flowing through the second coil to be smaller (including zero) than that when the plasma treatment carried out, or by causing a current flowing through the second coil to flow in a reverse direction.

In addition, when ac power is applied to an oxygen plasma producing gas to produce a plasma and when the fluorine containing carbon film is removed by this plasma, the cleaning step is preferably carried out while turning the ac power on and off by a pulse having a lower frequency than that of the ac power. The cleaning step may be carried out each time a thin film deposition treatment for one substrate to be treated is carried out.

The oxygen plasma producing gas is preferably selected from the group consisting of oxygen gas, a gas comprising oxygen gas and hydrogen gas, a gas comprising oxygen gas and a fluorine containing gas, a gas of a compound of oxygen and fluorine, water vapor, a gas of a compound of carbon and oxygen, and a gas of a compound of nitrogen and oxygen. The cleaning step may be carried out using an oxygen plasma producing gas comprising oxygen gas, and then, using an oxygen plasma producing gas comprising a gas of a compound of oxygen and fluorine.

Moreover, according to the present invention, the emission intensity at a specific wavelength emitted from a predetermined active species, which is produced in the vacuum vessel when the cleaning step is carried out, is preferably detected, and the finish time of the cleaning is preferably determined on the basis of the detected result.

According to the present invention, a plasma treatment method comprises: a thin film deposition step of transferring a substrate to be treated, onto a transfer table provided in a vacuum vessel, and producing a plasma of a thin film deposition gas to deposit a fluorine containing carbon film on the substrate by means of the plasma of the thin film deposition gas; a cleaning step of producing a plasma of a cleaning gas, and removing the fluorine containing carbon film adhered in the vacuum vessel, by means of the plasma of the oxygen plasma producing gas; and a pretreatment thin film deposition step of producing a plasma of a pretreatment thin film deposition gas, and forming a thin film for preventing particles from being produced, such as a fluorine containing carbon film or an amorphous carbon hydride film, on an inner wall of the vacuum vessel by means of the plasma of the pretreatment thin film deposition gas. The pretreatment thin film deposition gas for depositing the fluorine containing carbon film may be a gas containing a compound of carbon and fluorine, the compound having a double bond or a triple bond.

BRIEF DESCRIPTION OF THE DRAWINGS

FIG. 3 is a table showing the results of experiments for determining the influence of a microwave power density in the cleaning of a CF film with $O_2$;

FIG. 5 is a table showing the results of experiments for determining the influence of a magnetic field in the cleaning of a CF film with $O_2$;

FIG. 7 is a table showing the results of experiments for determining the influence of a cleaning gas in the cleaning of a CF film;

FIG. 13 is a table showing the results of experiments for determining the influence of a cleaning gas in the cleaning of a CF film;

FIG. 14 is a table showing the results of experiments for determining the influence of a cleaning gas in the cleaning of a CF film;

BEST MODE FOR CARRYING OUT THE INVENTION

The preferred embodiment of a method for cleaning a plasma treatment system according to the present invention will be described. The inventors studied various gases serving as cleaning gases for use in the cleaning for removing a CF film adhered in a vacuum vessel of a plasma treatment system, and found that oxygen ($O_2$) was effective. In this preferred embodiment, $O_2$ is used as a cleaning gas to clean a plasma treatment system wherein a CF film is adhered.

Figure 1:
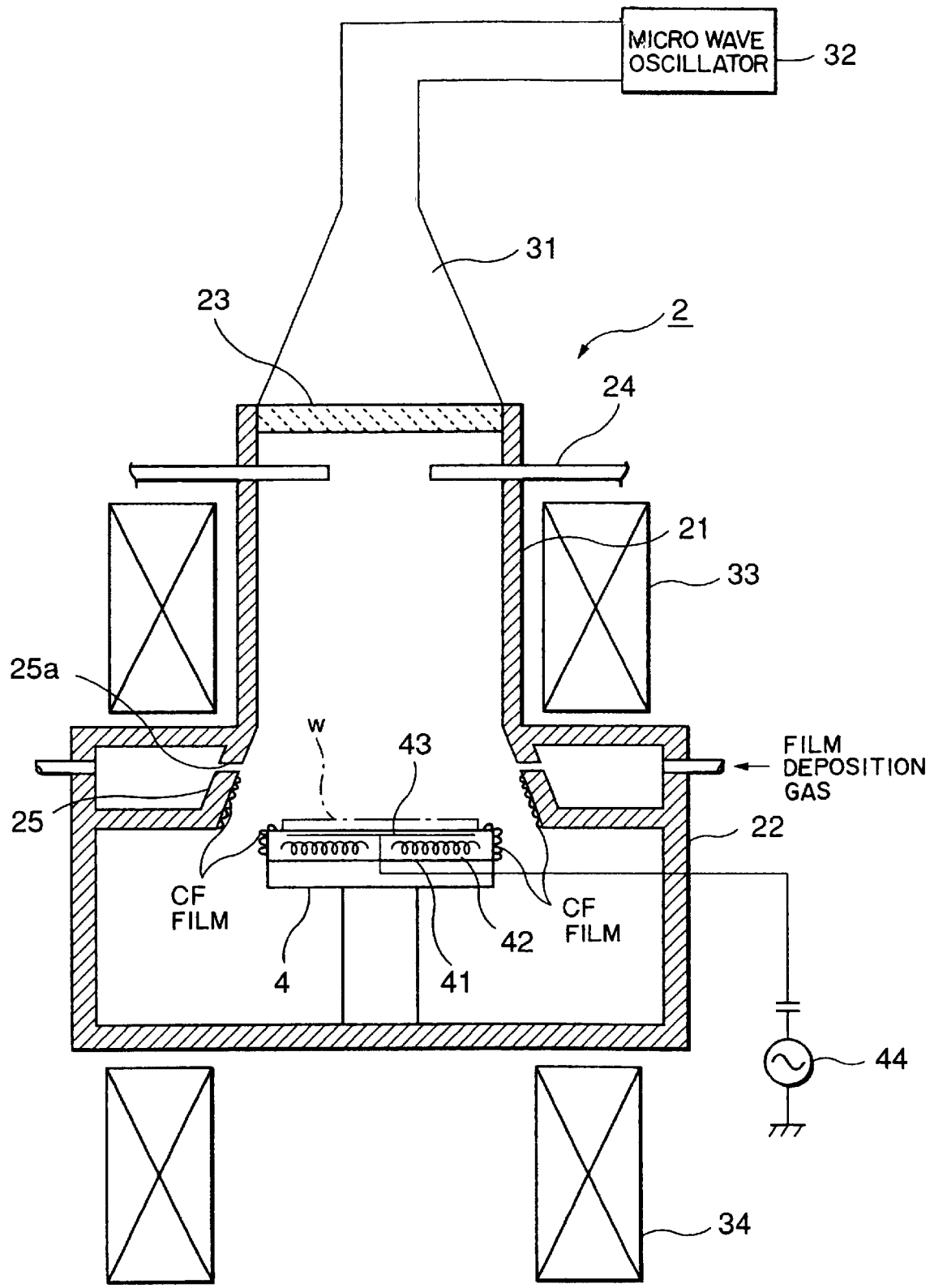
FIG. 1 is a sectional view of a plasma treatment system, in which a preferred embodiment of a cleaning according to the present invention is carried out.

Referring to FIG. 1, an embodiment of a plasma treatment system for depositing a CF film on a substrate to be treated, will be described. This plasma treatment system uses the ECR (Electron Cyclotron Resonance). In the drawing, reference number 2 denotes a vacuum vessel of, e.g., aluminum. The vacuum vessel 2 comprises a cylindrical plasma chamber 21 arranged in an upper portion for producing a plasma, and a cylindrical thin film deposition chamber 22, which is arranged below the plasma chamber 21 to be connected so as to be communicated therewith and which has a greater inner diameter than that of the plasma chamber 21.

The upper end surface of the vacuum vessel 2 comprises a transmission window 23 for transmitting a microwave. On the upper surface of the transmission window 23, there is provided a waveguide 31 for supplying a microwave of, e.g., 2.45 GHz, into the plasma chamber 21. The other end of the waveguide 31 is connected to a microwave oscillator 32. In this embodiment, the waveguide 31 and the microwave oscillator 32 are associated with each other to form a high frequency supply means.

Around the side wall for dividing the plasma chamber 21, a ring-shaped main solenoid coil 33 (which will be hereinafter referred to as a "main coil 33") serving as a magnetic field forming means is arranged so as to be adjacent the side wall thereof, so that a magnetic field of, e.g., 875 gausses, can be formed in the plasma chamber 21 so as to extend from top to bottom. Below the bottom wall of the thin film deposition chamber 22, a ring-shaped sub-solenoid coil 34 (which will be hereinafter referred to as a "sub-coil 34") is arranged.

In the side wall for diving the plasma chamber 21, plasma gas nozzles 24 are arranged at regular intervals in the circumferential directions thereof. The nozzles 24 are connected to a plasma gas source (not shown) and a cleaning gas source (not shown) so that a plasma gas and a cleaning gas can be uniformly supplied to the upper portion in the plasma chamber 21. Furthermore, although only two nozzles 24 are shown in the drawing to simplify the drawing, two or more nozzles 24 are provided in fact.

On the other hand, the thin film deposition chamber 22 is provided with a ring-shaped gas ring 25 at the upper end thereof. The gas ring 25 is formed with a gas supply opening 25a for introducing thin film deposition gases, e.g., $C_4F_8$ gas and $C_2H_4$ gas, into the thin film deposition chamber 22. The gas ring 25 is connected to reactive gas sources (not shown), e.g., a $C_4F_8$ gas source and a $C_2H_4$ gas source. At a substantially central portion in the thin film deposition chamber 22, there is provided a vertically movable transfer table 4 for transferring a substrate to be treated, e.g., a semiconductor wafer W (which will be hereinafter referred to as a "wafer"). The transfer table 4 comprises a body 41 of, e.g., aluminum, and a ceramics body 43 having a heater therein. The transfer surface of the transfer table 4 serves as an electrostatic chuck. The ceramics electrostatic chuck 42 of the transfer table 4 has therein an electrode 43, to which a bias for drawing ions into the wafer W is applied. The electrode 43 is connected to, e.g., a high frequency power supply 44 for drawing a plasma. In the bottom of the thin film deposition chamber 22, an exhaust port (not shown) is formed.

A thin film deposition treatment for a CF film, which is carried out using the above described system, will be described below. First, a wafer W, on the surface of which an interconnection layer of aluminum has been formed, is introduced from a load-lock chamber (not shown) to be transferred onto the transfer table 4. Subsequently, the interior of the vacuum vessel 2 is evacuated to a predetermined degree of vacuum, and a plasma gas, e.g., Ar gas, is introduced from the plasma gas nozzles 24 into the plasma chamber 21 as well as thin film deposition gases, e.g., $C_4F_8$ gas and $C_2H_4$ gas, are introduced from the gas ring 25 into the thin film deposition chamber 22 at flow rates of 60 sccm and 30 sccm, respectively. Then, the pressure in the vacuum vessel 2 is maintained to be a process pressure of, e.g., 0.2 Pa, and a bias voltage of 13.45 MHz and 1500 W is applied to the transfer table 4 while the surface temperature of the transfer table 4 is set to be 320° C.

A high frequency wave (a microwave) of 2.45 GHz produced by the microwave oscillator 32 is carried in the waveguide 31 to be introduced into the plasma chamber 21 via the transmission window 23. In the plasma chamber 21, a mirror field produced by the main coil 33 and the sub-coil 34 is applied at a magnitude of 875 gausses. The interaction between the magnetic field and the microwave causes electron cyclotron resonance to produce a plasma of Ar gas and to increase the density thereof.

The plasma flow, which has flowed into the thin film deposition chamber 22 from the plasma chamber 21, activates (produces plasmas of) the $C_4F_8$ and $C_2H_4$ gases, which are supplied therein, to form active species (plasmas).

On the other hand, the active species transported onto the wafer W are deposited as a CF film. At this time, Ar ions, which are drawn into the wafer W by the plasma drawing bias voltage, chip off the CF film, which has been deposited at the corners on the pattern on the surface of the wafer W, by the sputter etching function, and deposit the CF film from the bottom of the pattern grove while expanding the frontage thereof, so that the CF film is embedded into a recessed portion without producing voids.

Then, a cleaning, which is carried out after the above described thin film deposition treatment in the above described plasma treatment system, will be described. If a predetermined thin film deposition treatment is carried out for the wafer W, the CF film is also adhered to portions wherein the thin film deposition gas reaches, e.g., to the surrounding portion of the wafer W on the transfer table 4, the outer periphery portion of the transfer table 4, and the surrounding portion of the gas supply opening 25a. The cleaning is a treatment for removing the CF film adhered in the vacuum vessel 2, and carried out after the thin film deposition treatment for, e.g., 12 wafers W, is completed.

Specifically, after the twelfth wafer W is carried out of the vacuum vessel 2, $O_2$ gas serving as a cleaning gas (an oxygen plasma producing gas) is introduced from the plasma gas nozzles 24 into the plasma chamber 21 at a flow rate of, e.g., 200 sccm, and a microwave of 2.45 GHz is introduced from the microwave oscillator 32 while a magnetic field having a magnitude of, e.g., 875 gausses is applied by operating the main coil 33 and the sub-coil 34. In this state, the cleaning is carried out.

Thus, a mirror field, which will be described later, is formed in the thin film deposition chamber 22, and the interaction between the magnetic field and the microwave causes the electron cyclotron resonance to produce an oxygen plasma from $O_2$ gas and to increase the density thereof. The active species (plasma) of O thus produced, which comprises O radicals and ions, reacts with the CF film, which is adhered to the surrounding portions of the gas supply opening 25a and the transfer table 4, to decompose the CF film into, e.g., $CO_2$ gas and $F_2$ gas, to scatter and discharge them to the outside of the thin film deposition chamber 22 via an exhaust port (not shown).

An example of experiment, which was carried out for verifying the advantages in this preferred embodiment, will be described. The plasma treatment chamber shown in FIG. 1 was used as an experimental system. From the plasma gas nozzles 24, $O_2$ gas was introduced at a flow rate of 200 sccm, and a wafer W, which had been transferred onto the transfer table and on which a CF film had been deposited, was etched with the plasma of $O_2$. In this case, the etch rate was calculated to derive the amount of the removed CF film. Other conditions included a pressure of 0.1 Pa, a mirror field, and various microwave powers. In addition, the same experiment was carried out by introducing $NF_3$ gas at a flow rate of 200 sccm in place of $O_2$. These results are shown in FIG. 2.

Figure 2:
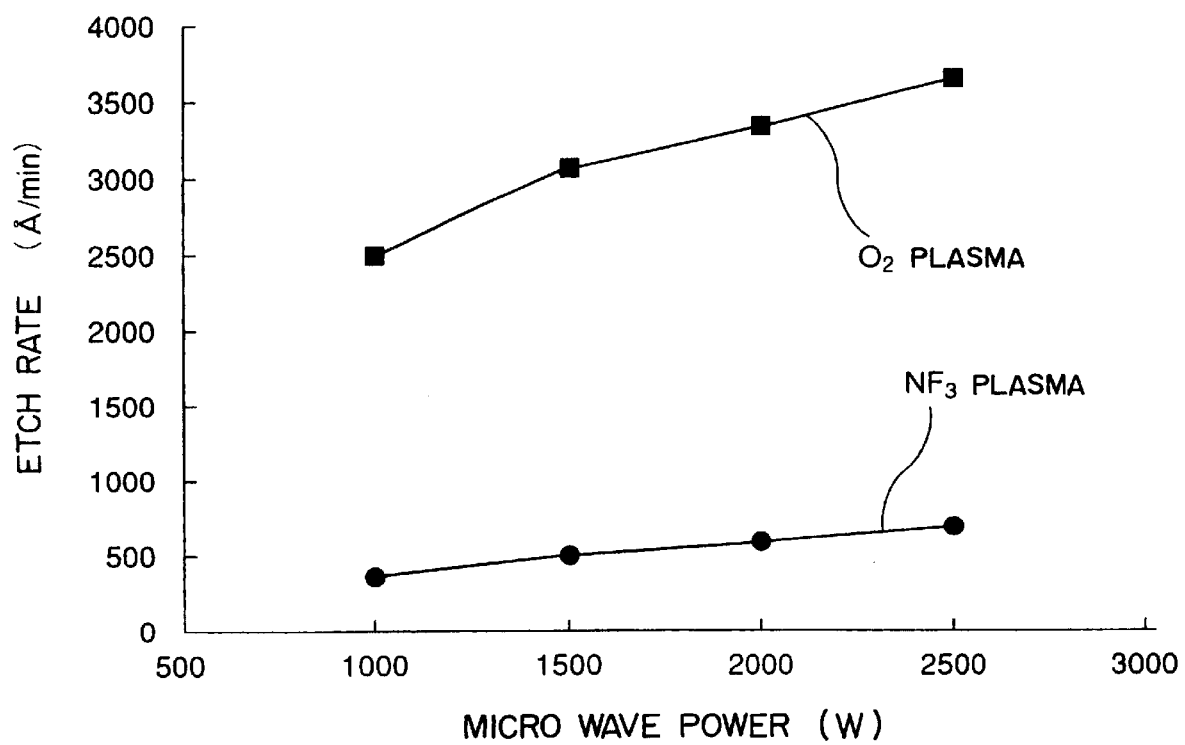
FIG. 2 is a characteristic diagram of an etching for a CF film with $O_2$.

It can be seen from the results of FIG. 2 that when $O_2$ gas is used, the etch rate is far higher than that in the case where $NF_3$ gas is used, so that $O_2$ gas has a higher rate for removing the CF film than that of $NF_3$ gas.

Therefore, in the plasma treatment system shown in FIG. 1, after a CF film having a thickness of 5 μm was deposited on a wafer W having a size of 8 inches at a pressure of 0.2 Pa at a microwave power of 2700 W, $O_2$ gas serving as a cleaning gas was introduced at a flow rate of 200 sccm, and the cleaning of the CF film was carried out at a pressure of 0.1 Pa at a microwave power 2500 W in a mirror field. After 30 minutes, the CF film was completely removed, and the cleaning time was shortened to be 1/10 through 1/5 in comparison with the case where the cleaning was carried out by introducing $NF_3$ gas at a flow rate of 200 sccm. From these results, it was verified that $O_2$ gas was effective in the cleaning of the CF film.

It is conceived that the reason why $O_2$ gas is effective in the cleaning of the CF film is as follows. That is, when $O_2$ gas is used as a cleaning gas, the active species of O caused by the plasma production strikes the surface of the CF film to physically cut the C—C and C—F bonds in the CF film. In addition, the C—C bond and so forth are also cut by a chemical reaction of the active species of O with C (carbon) of the CF film to form $CO_2$. From these cut portions, $O_2$ gas penetrates into the CF film to cut the C—C and C—F bonds in the CF film. Thus, it is guessed that the active species of O reacts with C of the CF film to form $CO_2$ gas and that F (fluorine) forms $F_2$ gas, and it is conceived that these gases scatter to remove the CF film.

On the other hand, when $NF_3$ gas is used as a cleaning gas, it is guessed that the active species of F caused by the plasma production cut the C—C and C—F bonds on the surface of the CF film, and after these bonds are cut, F scatters as $F_2$ gas and $NF_3$ gas, and C scatters as $CF_4$ to remove the CF film.

It is also conceived that the formation of $CO_2$ based on the reaction of O with C is easier to occur than the formation of $CF_4$ based on the reaction of F with C. Therefore, it is conceived that the active species of O is easier to penetrate into the CF film than F since the active species is easy to form $CO_2$ to cut the C—C and C—F bonds in the CF film. Thus, it is guessed that when the cleaning is carried out, $O_2$ gas is easier to cut the C—C and C—F bonds to penetrate into the CF film than $NF_3$ gas, so that the cleaning rate increases to shorten the cleaning time.

Thus, according to this preferred embodiment, since $O_2$ gas is used as a cleaning gas for a CF film, it is possible to shorten the cleaning time required for the cleaning of the CF film adhered in the vacuum vessel 2, to improve the throughput in the thin film deposition treatment.

Then, another preferred embodiment of the present invention will be described. In this preferred embodiment, a power density of a microwave is set to be 10 kW/m³ or more during cleaning in the above described preferred embodiment. The microwave power density is calculated by dividing a microwave power by the volume of the vacuum vessel 2. For example, when the microwave power is 2000 W and the volume of the vacuum vessel 2 is 0.2 m$^3$, the microwave power density is 10 kW/m$^3$.

Since it was verified from the above described experiment shown in FIG. 2 that the etch rate increases as the microwave power increases, the inventors carried out the cleaning at various microwave power densities and found that the cleaning rate increases when the microwave power density is 10 kW/m$^3$ or more.

An example of experiment, which was carried out by the inventors, will be described. The plasma treatment system shown in FIG. 1 was used as an experimental system. After a CF film having a thickness of 10 $\mu$m was deposited on a wafer W having a size of 8 inches at a pressure of 0.2 Pa using a microwave having a power of 2700 W and a power density of 14.5 kW/m$^3$, $O_2$ gas serving as a cleaning gas was introduced at a flow rate of 200 sccm to carry out the cleaning of the CF film at various microwave power densities. In this case, the pressure was 0.2 Pa, and a mirror field was formed. The cleaning state was observed, and the time required to remove the CF film was measured. These results are shown in FIG. 3(a). In addition, the same experiment was carried out by introducing $NF_3$ and $N_2$ gases as cleaning gases at flow rates of 500 sccm, respectively, after depositing an $SiO_2$ film having a thickness of 10 $\mu$m. These results are shown in FIG. 3(b).

From the results of FIG. 3, it can be seen that when the $SiO_2$ film is cleaned with $NF_3$ and $N_2$ gases, the cleaning time is shortened by only 5 minutes even if the microwave power density is increased from 6 kW/m$^3$ to 10 kW/m$^3$, whereas when the CF film is cleaned with $O_2$ gas, the cleaning time is shortened by 20 minutes to be two thirds if the microwave power density is changed from 6 kW/m$^3$ to 10 kW/m$^3$, so that the microwave power density has a greater influence on the cleaning of the CF film than the influence on the cleaning of the $SiO_2$ film.

In addition, when the CF film is cleaned, the cleaning time is shortened by 10 minutes if the microwave power density is increased from 9 kW/m$^3$ to 10 kW/m$^3$, whereas the shortened time is 3 minutes even if the microwave power density is increased from 10 kW/m$^3$ to 11 kW/m$^3$, so that the degree of the shortened time decreases. Therefore, when the cleaning is carried out, the microwave power density is preferably set to be 10 kW/m$^3$ or more.

It is conceived that the reason why the influence of the microwave power density is great when carrying out the cleaning of the CF film is as follows. When the microwave power density increases, the plasma density also increases. When the plasma density increases, the energy of the active species of O activated by plasma increases. The active species of O have different energies so that some active species reach the adhered CF film to contribute to remove the CF film, and the energy of some active species is too small to reach the CF film. Therefore, if the energy of the active species increases as described above, more active species can reach to the adhered CF film.

As described above, it is conceived that the C—C and C—F bonds on the surface of the CF film are physically cut by the active species of O activated by the plasma and also chemically cut by the formation of $CO_2$, so that the cleaning with $O_2$ gas proceeds. When the density of plasma itself increases and the energy of the active species of O increases, the amount of the active species of O reacting the CF film increases, so that the physical and chemical cutting forces also increase. Therefore, it is guessed that the C—C bonds and so forth are easier to be cut, so that $O_2$ gas is easier to penetrate into the CF film to promote the cleaning treatment.

On the other hand, in the cleaning of the $SiO_2$ film, it is conceived that the Si—O bond on the surface of the $SiO_2$ film is cut by the chemical reaction of the active species of F obtained by the activation of $NF_3$. Therefore, when the microwave power density increases to allow the plasma density to increase, the energy of F activated by the plasma increases. Consequently, although the cleaning rate increases, the physical force has no influence upon the $SiO_2$ film, so that the degree of promotion of cleaning decreases.

Thus, in this embodiment, since the microwave power density is set to be 10 kW/m$^3$ in the cleaning of the CF film, it is possible to shorten the cleaning treatment time for the CF film adhered in the vacuum vessel 2, so that it is possible to improve the throughput in the thin film deposition treatment.

Figure 4:
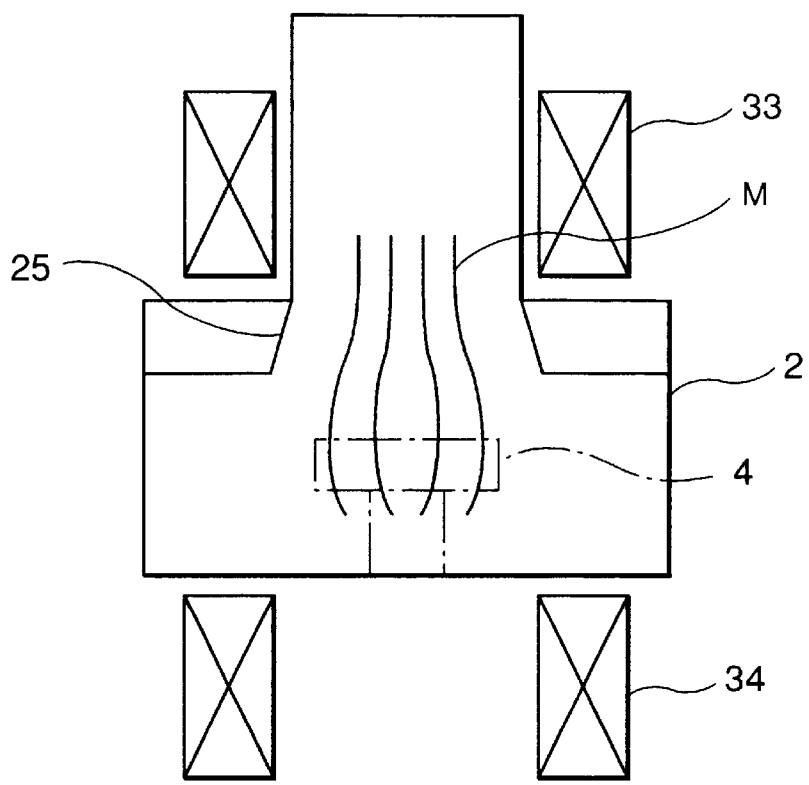
FIG. 4(a) is a schematic diagram showing a mirror field.
FIG. 4(b) is a schematic diagram showing a divergent field.
Figure 4:
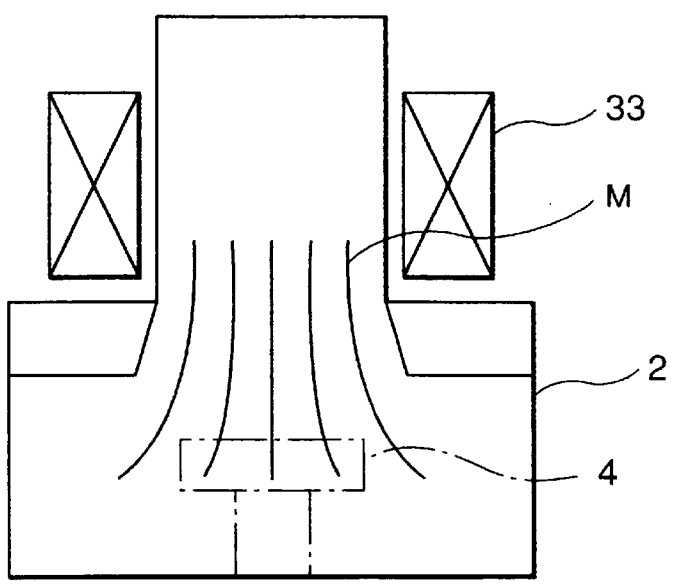

Then, another embodiment in this preferred embodiment will be described. In this embodiment, the magnetic field is set to be a divergent field when the cleaning is carried out in the cleaning method in the above described preferred embodiment. Referring to FIG. 4, the mirror field and the divergent field will be described. As shown in FIG. 4(a), the mirror field is formed by operating the main coil 33 and the sub-coil 34 so as to confine a magnetic field M around the transfer table 4. On the other hand, as shown in FIG. 4(b), the divergent field is formed by operating only the main coil 33 to form a magnetic field M so as to expand downwards around the transfer table 4.

An example of experiment, which was carried out by the inventors, will be described. As an experimental system, the plasma treatment system shown in FIG. 1 was used. After a CF film having a thickness of 10 $\mu$m was deposited on a wafer W having a size of 8 inches at a microwave power of 2700 W, $O_2$ gas serving as a cleaning gas was introduced at a flow rate of 200 sccm, and a mirror field or a divergence field was formed as a magnetic field to carry out the cleaning treatment of the CF film at a pressure of 20 Pa at a microwave power of 2500 W. In this case, the mirror field was formed at a current of 200 A passing through the main coil 33 and at a current of 200 A passing through the sub-coil 34, and the divergent field was formed at a current of 200 A passing through the main coil 33 and at a current of 0 A passing through the sub-coil 34. The cleaning state was visually observed, and the time required to remove the CF film from the surrounding portion of the gas supply opening 26a and the surface and outer peripheral portion of the transfer table 4 (the surrounding portion of the transfer table 4) was measured. The pressure was changed to 0.2 Pa to carry out same experiment. These results are shown in FIG. 5.

As can be seen from the results of FIG. 5, in the case of the divergent field, the cleaning time for the surrounding portion of the transfer table was shorter than that in the mirror field, and the cleaning time for the surrounding portion of the gas supply opening was longer than that in the mirror field. However, since the cleaning for the surrounding portion of the gas supply opening 25a was completed when the cleaning for the surrounding portion of the transfer table was completed, the cleaning time in the divergent field was consequently shorter than that in the mirror field. Moreover, when the pressure was set to be 0.2 Pa, the cleaning time for the surrounding portion of the transfer table was shorten by 20 minutes in comparison with the case where the pressure was set to be 20 Pa. Therefore, it is guessed that the cleaning time for the CF film is shortened as the pressure is reduced.

It is conceived that the reason for this is as follows. As described above, in the cleaning of the CF film with $O_2$ gas, the plasma density greatly acts upon the cutting force for physically and chemically cutting the C—C bond and so forth of the CF film, so that the cleaning rate greatly vary due to the difference in plasma density. That is, since the plasma density increases as the magnetic flux density increases, the plasma is produced in the whole interior of the vacuum vessel 2. However, in the mirror field, a plasma region is formed so as to be confined near the upper portion, and in the divergent field, a plasma region is formed so as to expand downwards around the transfer table 4. The plasma region means a region where the plasma is confined by the ECR so that the density thereof is increased. In a region other than the plasma region, the plasma density is very low.

Therefore, in the surrounding portion of the gas supply opening 25a, the magnetic flux density and the cleaning rate in the divergent field are lower than those in the mirror field. However, it is conceived that in this portion, the divergent field is confined to some extent and the plasma density is originally high, so that the cleaning time is not so long.

On the other hand, in the surrounding portion of the transfer table, the divergent field exists in the plasma region. However, in the divergent field, the plasma diverges downwards, so that the plasma density decreases with lower side. Thus, it is conceived that in the surrounding portion of the transfer table, the magnetic flux density and the plasma density are lower than those near the gas supply opening 25a, so that the cleaning time is longer than that in the gas supply opening 25a. On the other hand, in the mirror field, the surrounding portion of the transfer table 4 are out of the plasma region so that the plasma density is considerably low. In accordance with this, the cleaning rate is also considerably decreased, so that the cleaning rate is considerably long.

It is conceived that the reason why the cleaning time is shortened as the pressure decreases is as follows. That is, at a low pressure, the mean free path of an O ion is long and the energy of the ion increases, so that the ion sputtering effect increases. As described above, since it is required to cut the C—C and C—F bonds of the C—F film, the cleaning rate increases as the amount of ions having a high energy increases.

Since the cleaning time was shortened in the divergent field, the cleaning time was measured when the $SiO_2$ film was cleaned with $NF_3$ and $N_2$ gases in each of the mirror field and the divergent field. However, the shortening of the cleaning time between these magnetic fields was not observed.

It is conceived that the reason why the influence of the magnetic field on the cleaning of the CF film is different from that of the $SiO_2$ film is that the cleaning procedures are different. As described above, in the cleaning with $O_2$ gas, the plasma density has a great influence upon the cleaning rate, so that the cleaning is difficult to proceed in a place which is out of the plasma region and in which the plasma density is very low. On the other hand, in the case of the cleaning for the $SiO_2$ film, since the plasma density does not have so great influence upon the cleaning based on the active species of F as described above, it is conceived that the cleaning proceeds even in a low plasma density place although its mechanism is not clear. Thus, it is conceived that since the plasma density in the cleaning for the CF film has a greater influence than that in the cleaning for the $SiO_2$ film, the influence of the magnetic field increases.

In this embodiment, in place of the divergent field, a cusp field may be formed by causing a current to flow in an opposite direction to the main coil 33 from the sub-coil 34. Also in the case of this cusp field, it is possible to increase the plasma density around the transfer table.

Thus, in this embodiment, since the divergent field or the cusp field is formed in the cleaning with $O_2$ gas for the CF film, the cleaning time for the CF film adhered in the vacuum vessel 2 can be shortened, so that it is possible to improve the throughput in the thin film deposition treatment.

Then, another modification in this preferred embodiment will be described. In this embodiment, the microwave for cleaning is supplied in the form of a pulse in the cleaning method in the above preferred embodiment. To supply a microwave in the form of a pulse means to turn on and off a microwave of, e.g., 2700 W and 2.45 GHz, which is oscillated by a microwave oscillator 32, by a frequency of, e.g., 100 to 5000 Hz, i.e., to modulate a microwave by a pulse. The duty ratio of the pulse may be set to be, e.g., 40 to 60%. Thus, when the microwave is supplied in the form of a pulse, it is possible to produce a plasma having a high energy, so that it is possible to increase the cleaning rate.

An example of an experiment, which was carried out by the inventors, will be described. As an experimental system, the plasma treatment system shown in FIG. 1 was used. A microwave of 2700 W and 2.45 Hz was supplied at a pressure of 500 Pa and a temperature of 350° .C in a mirror field (the current of the main coil 33 being 200 A and the current of the sub-coil 34 being 200 A) while turning on and off the microwave at a frequency of 100 to 5000 Hz in a duty ratio of 0.4 to 0.6, and $O_2$ gas serving as a cleaning gas was introduced at a flow rate of 500 sccm to etch a wafer W, on which a CF film has been deposited. In this case, the amount of the removed CF film was derived by calculating the etch rate. In addition, a microwave of 2700 W was continuously supplied to carry out the same experiment.

From these experiments, it was found that the cleaning rate (the etch rate) was 8000 angstrom/min when the microwave was supplied in the form of a pulse, whereas the cleaning rate was 4000 angstrom/min when the microwave was continuously supplied, so that the removing rate of the CF film increased when the microwave was supplied in the form of a pulse.

Therefore, in the plasma treatment system shown in FIG. 1, after a CF film having a thickness of 5 $\mu$m was deposited on a wafer W having a size of 8 inches at a pressure 0.2 Pa at a microwave power of 2700 W, a microwave of 2700 W and 2.45 GHz was supplied at a pressure of 500 Pa in a mirror field while turning on and off the microwave at a frequency of 100 to 5000 Hz in a duty ratio 0.4 to 0.6, and $O_2$ gas serving as a cleaning gas was introduced at a flow rate of 500 sccm to carry out the cleaning of the CF film. In this case, the cleaning time was about 6 minutes. On the other hand, when a microwave of 2700 W was continuously supplied and other conditions were the same, the measured cleaning time was 12 minutes. From these results, it was found that when the microwave was supplied in the form of a pulse, the cleaning time was shortened by about 6 minutes in comparison with the case where the microwave was continuously supplied.

It is conceived that the reason why the cleaning time is shortened when a microwave is supplied in the form of a pulse is as follows. That is, the microwave power is determined by (the number of electron)×(energy of electrons). At the beginning of the supply of the microwave, the energy of electrons is very high since the number of electrons is small.

Figure 6:
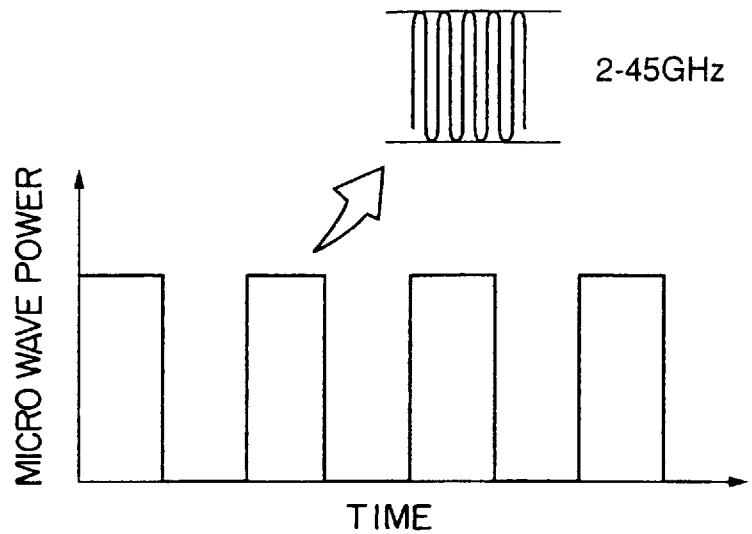
FIG. 6 is a characteristic diagram showing an electron energy when a microwave is supplied in the form of a pulse.
Figure 6:
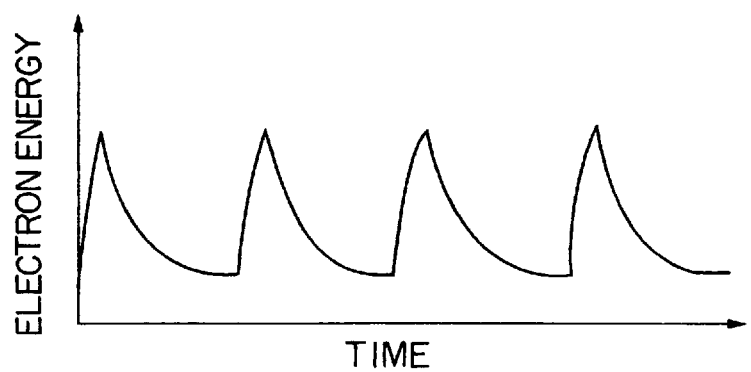
Figure 6:
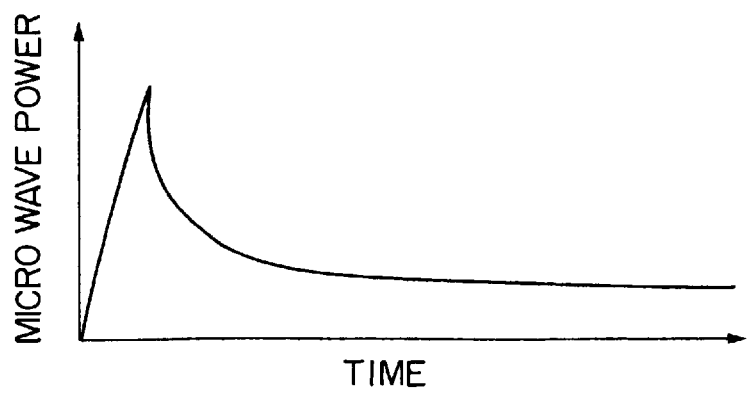

Thereafter, the number of electrons exponentially increases by the avalanche phenomenon, so that the energy of electrons decreases to be stable. Therefore, when a microwave is supplied in the form of a pulse, electrons having a high energy are supplied every pulse as shown in FIGS. 6(a) and 6(b), so that a plasma having a high energy is continuously produced. Furthermore, for comparison, FIG. 6(c) shows the variation in electron energy when a microwave is continuously supplied as by conventional methods. When the energy of a plasma increases as this modification, the energy of the active species activated by the plasma also increases, so that the amount of the active species reaching the CF film adhered in the vacuum vessel 2 increases, whereby the cleaning rate increases.

Thus, in this modification, since the microwave is supplied in the form of a pulse in the cleaning of the CF film with $O_2$ gas, it is possible to shorten the cleaning time of the CF film adhered in the vacuum vessel 2, so that it is possible to improve the throughput in the thin film deposition treatment.

Then, another modification in this preferred embodiment will be described. In this modification, each time the deposition on, e.g., one wafer W is carried out, the cleaning is carried in the above described preferred embodiment. Thus, when the cleaning is carried out each time the deposition on one wafer W is carried out, the cleaning time for one wafer is very short, e.g., about 15 seconds, since the amount of the CF film adhered in the vacuum vessel 2 is small.

After the wafer W, for which the ordinary thin film deposition has been carried out, is discharged, before the next wafer W is introduced, an electric charge removing treatment is carried out with, e.g., a plasma of $O_2$ for, e.g., about 10 seconds, in order to remove electric charges remaining on the transfer table 41. When the cleaning with $O_2$ gas is carried out each time the deposition on one wafer W is carried out, the electric charge removing treatment is carried out with the cleaning treatment since the cleaning time is longer than the electric charge removing treatment, so that it is not required to carry out only the electric charge removing treatment separately from the cleaning. Therefore, in comparison with the case where the cleaning is carried out after the deposition on 25 wafers W is carried out while the electric charge removing treatment is carried out when the wafers W are exchanged, the total treatment time required to treat the same number of wafers W can be shortened by (the electric charge removing time)×(the number of wafers W) in accordance with a simple calculation. Thus, it is possible to improve the throughput.

When the cleaning is carried out after the deposition on 25 wafers is carried out, if the amount of the CF film adhered in the vacuum vessel 2 increases, the internal state of the vacuum vessel 2 changes, and the quality of the adhered CF film changes so that the CF film is more rigidly adhered. Thus, since it is difficult to remove the CF film, the total cleaning time is longer than that in the case where the cleaning is carried out each time the deposition on one wafer W is carried out. Thus, when the cleaning is carried out each time the deposition on one wafer W is carried out, the total cleaning time can be also shortened, so that it is possible to improve the throughput.

An example of experiment, which was carried out by the inventors, will be described below. As an experimental system, the plasma treatment system shown in FIG. 1 was used. A CF film was deposited on a wafer W having a size of 8 inches at a pressure of 0.2 Pa at a microwave power of 2700 W. Each time the deposition on one wafer W was carried out, $O_2$ gas serving as a cleaning gas was introduced at a flow rate of 500 sccm to carry out the cleaning of the CF film at a pressure of 500 Pa at a microwave power of 2700 W in a divergent magnetic field. The total treatment time required to deposit 25 wafers W was measured. In addition, under the same conditions, after the deposition on 25 wafers W was carried out while carrying out the electric charge removing treatment for 10 seconds when exchanging the wafer W, the cleaning was carried out, and the total treatment time was measured.

From these experiments, it was found that when the cleaning was carried out each time the deposition on one wafer W was carried out, the average cleaning time was about 15 seconds and the total treatment time was 68 minutes and 45 seconds, whereas when the cleaning was carried out after the deposition on 25 wafers W was carried out, the cleaning time was about 30 minutes and the total treatment time was 92 minutes and 30 seconds.

Thus, in this modification, since the cleaning of the CF film with $O_2$ gas is carried out each time the deposition on one wafer W is carried out, the total treatment time can be shortened, so that it is possible to improve the throughput in the thin film deposition treatment.

In the above preferred embodiment, a plasma gas, e.g., Ar gas, may be supplied with the cleaning gas in the cleaning treatment. In addition, when the CF film is deposited, the CF film is adhered to the inner wall surface of the vacuum vessel 2 in addition to the surrounding portions of the transfer table 4 and the gas supply opening 25a. However, the CF film adhered to the inner wall surface of the vacuum vessel 2 is a weaker and thinner film than the CF film adhered to the surrounding portion of the transfer table 4, and the amount thereof is small. Therefore, when the cleaning of the surrounding portion of the transfer table 4 is completed, the cleaning of the inner wall of the vacuum vessel 2 has been already completed.

Then, another preferred embodiment of the present invention will be described. The difference between this preferred embodiment and the above described preferred embodiment is that $O_2$ gas is combined with $H_2$ gas or a F containing gas, such as $CF_4$ or $NF_3$ gas, to be used as a cleaning gas. The $O_2$ gas and $H_2$ gas or the like may be simultaneously supplied. Alternatively, $H_2$ gas or the like may be supplied after supplying $O_2$ gas.

An example of experiment, which was carried out by the inventors, will be described. As an experimental system, the plasma treatment system shown in FIG. 1 was used. After a CF film having a thickness of 10 μm was deposited on a wafer W having a size of 8 inches at a microwave power of 2700 W, a cleaning gas is introduced to carry out the cleaning of the CF film at a pressure of 0.2 Pa at a microwave power of 2500 W in a mirror field.

As a cleaning gas, only $O_2$ gas (flow rate: 200 sccm), $O_2$ gas+$H_2$ gas ($O_2$ gas flow rate: 200 sccm, $H_2$ gas flow rate 100 sccm), $O_2$ gas+$CF_4$ gas ($O_2$ gas flow rate: 200 sccm, $NF_3$ gas flow rate: 200 sccm), $O_2$ gas+$NF_3$ gas ($O_2$ gas flow rate: 200 sccm, $NF_3$ gas flow rate: 200 sccm) were used. The cleaning state is visually observed, and the time required to remove the CF film was measured. The results are shown in FIG. 7(a).

In addition, when $NF_3$ gas was introduced after introducing $O_2$ gas as cleaning gases ($O_2$ gas flow rate: 200 sccm, $NF_3$ gas flow rate: 500 sccm), and when $NF_3$ gas+$N_2$ gas were introduced after introducing $O_2$ gas as cleaning gasses ($O_2$ gas flow rate: 200 sccm, $NF_3$ gas flow rate: 500 sccm, $N_2$ gas flow rate: 500 sccm), the same experiments were carried out. In these cases, the pressure was 0.2 Pa when introducing $O_2$ gas, and 120 Pa when introducing $NF_3$ gas. The results are shown in FIG. 7(b).

From these results, it was found that if $O_2$ gas is combined with $H_2$ gas or a F containing gas as a cleaning gas, the cleaning rate increases in comparison with that in the case where only $O_2$ gas is used, so that the cleaning time can be shortened. It is conceived that the reason why the cleaning rate using the combination of $O_2$ gas with $H_2$ gas is higher than the cleaning rate using $O_2$ gas alone is that, as described above, the active species of O reacts with C of the CF film to form $CO_2$ and the active species of H reacts with F of the CF film to form HF, so that the C—C and C—F bonds are easily cut.

In addition, since the cleaning rate using the combination of $O_2$ gas with the F containing gas is higher than the cleaning rate using $O_2$ gas alone, the influence of the plasma density in the cleaning based on the active species of F is smaller than that in the cleaning based on the active species of O as described above. Therefore, it is conceived that in a mirror field around the transfer table 4 or the like, the cleaning rate based on the active species of F is higher than the cleaning rate based on the active species of O in a place which is out of the plasma region and where the plasma density is very low, although its mechanism is not clear. In this case, it is conceived that the reason why the combination of $O_2$ gas with $NF_3$ gas is good is that in the case of the combination of $O_2$ gas with $H_2$gas or the combination of $O_2$ gas with $CF_4$ gas, the cleaning gases are easy to react with each other to form $H_2O$ or $CO_3$, whereas in the case of the combination Of $O_2$ gas with $NF_3$ gas, the cleaning gases are difficult to react with each other.

From these experiments, it was found by visual observation that the cleaning rate around the gas supply opening 25a is low when using $NF_3$ gas, and the cleaning rate in this place is high when using $O_2$ gas or the combination of $O_2$ gas with $H_2$ gas, and that the cleaning rate around the transfer table 4 is high when using the F containing gas, particularly $NF_3$ gas. It was also found that the adhered CF film was removed from the top in the vacuum vessel 2 in the cleaning, and that there were some cases where the remove CF film was adhered again on the lower side. From these results, it is conceived that it is desired to clean the surrounding portion of the transfer table 4 with a F containing gas, particularly $NF_3$ gas, after cleaning the inner wall portion of the gas ring 25 with a gas containing $O_2$ gas.

Thus, in this preferred embodiment, since $O_2$ gas is combined with $H_2$ gas or the F containing gas as the cleaning gases for the CF film, the cleaning time for the CF film adhered in the vacuum vessel 2 can be shortened, so that it is possible to improve the throughput in the thin film deposition treatment.

Then, another preferred embodiment of the present invention will be described. This preferred embodiment was made on the basis of the fact that the combination of $O_2$ gas with $H_2$ gas was effective in the cleaning. The difference between this preferred embodiment and the above described preferred embodiment is that $H_2O$ liquid or gas (water vapor) is introduced into the vacuum vessel 2 when the cleaning is carried out. In this case, $H_2O$ may be supplied alone, or combined with a plasma gas, such as $O_2$ gas or Ar gas, to be supplied.

Figure 8:
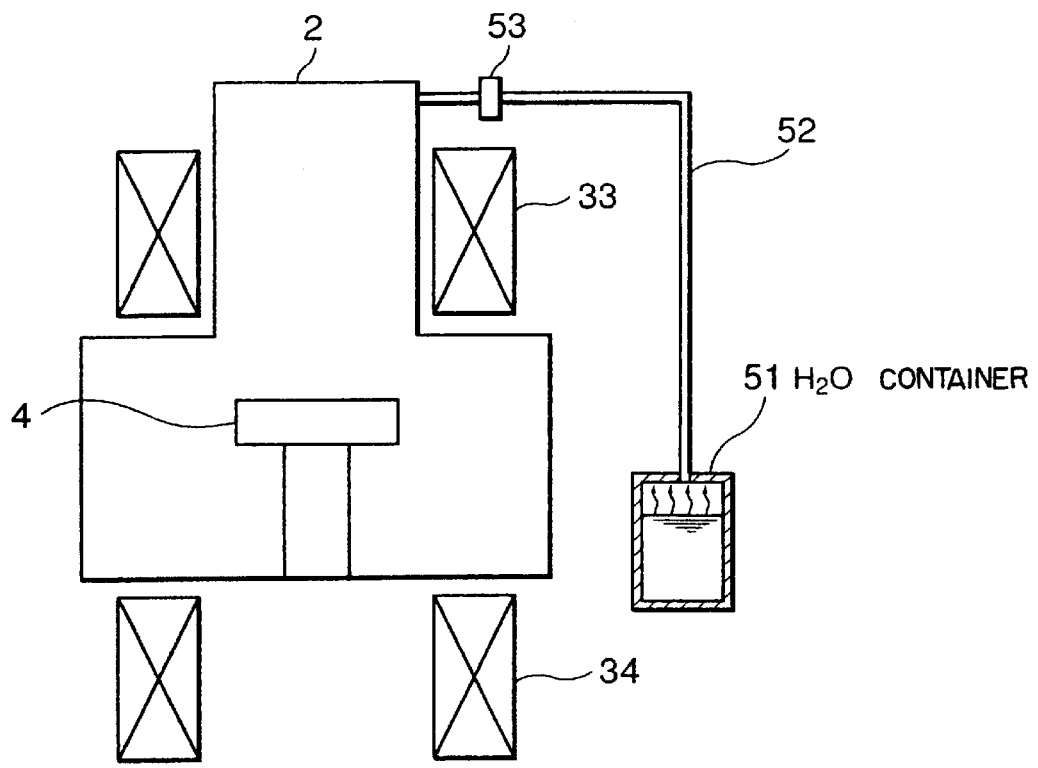
FIG. 8 is a sectional view of a plasma treatment system, in which another preferred embodiment of a cleaning according to the present invention is carried out.

Referring to FIGS. 8 through 11, plasma treatment systems for carrying out the cleaning in this preferred embodiment will be described. A plasma treatment system shown in FIG. 8 is designed to introduce $H_2O$ in a gas state. This plasma treatment system includes an $H_2O$ container 51 for reserving therein $H_2O$ in a liquid state, and an $H_2O$ supply pipe 52 for connecting the $H_2O$ container 51 and the upper portion of the side wall of a plasma chamber 21 via a mass flow 53. Other constructions are the same as those of the above described plasma treatment system shown in FIG. 1.

In such a plasma treatment system, when the cleaning is carried out, the pressure in the plasma chamber 21 is, e.g., about 0.2 Pa, which is far lower than that in the $H_2O$ container 51, so that $H_2O$ in the $H_2O$ container 51 is vaporized and supplied to the plasma chamber 21 via the mass flow 53 at a flow rate of, e.g., 0.01 sccm. This $H_2O$ gas is changed to plasmas serving as active species of H and O in the plasma chamber 21 to react with C and F of a CF film to form $CO_2$ and HF to carry out the cleaning.

Figure 9:
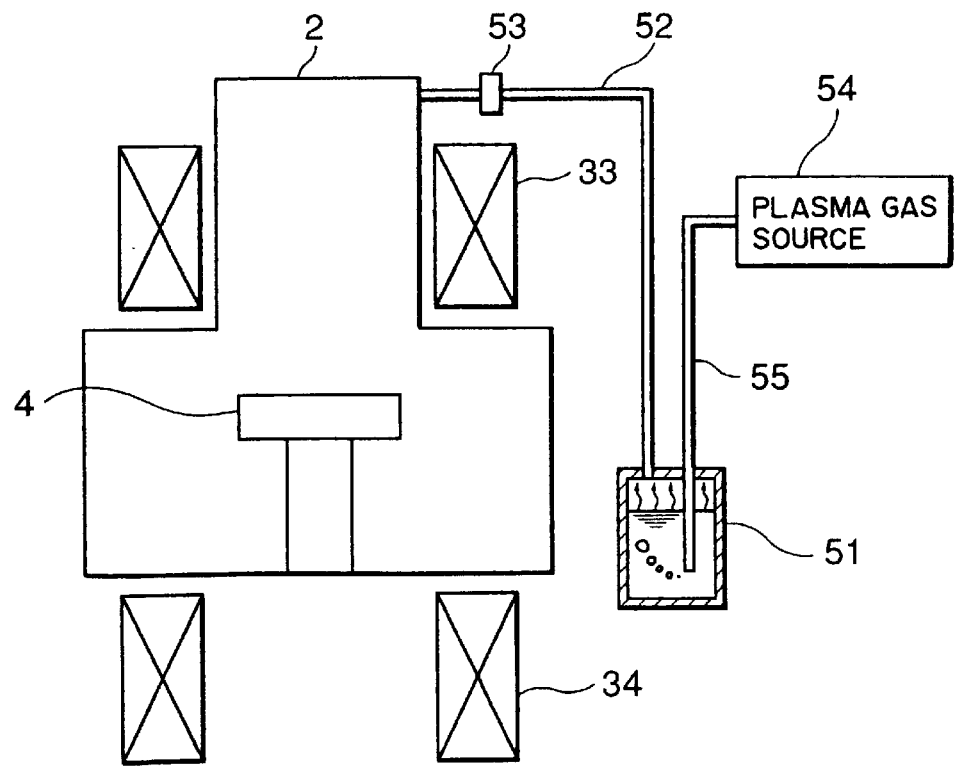
FIG. 9 is a sectional view of another embodiment of a plasma treatment system, in which another preferred embodiment of a cleaning according to the present invention is carried out.

A plasma treatment system shown in FIG. 9 is also designed to introduce $H_2O$ in a gas state. This plasma treatment system includes a plasma gas source 54, connected to an $H_2O$ container 51 via a gas supply pipe 55, for supplying a plasma gas, such as Ar gas or $O_2$ gas, into $H_2O$ in the $H_2O$ container 51 to supply a plasma gas containing $H_2O$ gas as a moisture content into the plasma gas chamber 21. In such a plasma treatment system, $H_2O$, together with the plasma gas, is supplied at a flow rate of, e.g., 300 sccm, to be changed to plasmas to react with C and F of a CF film to carry out the cleaning.

Figure 10:
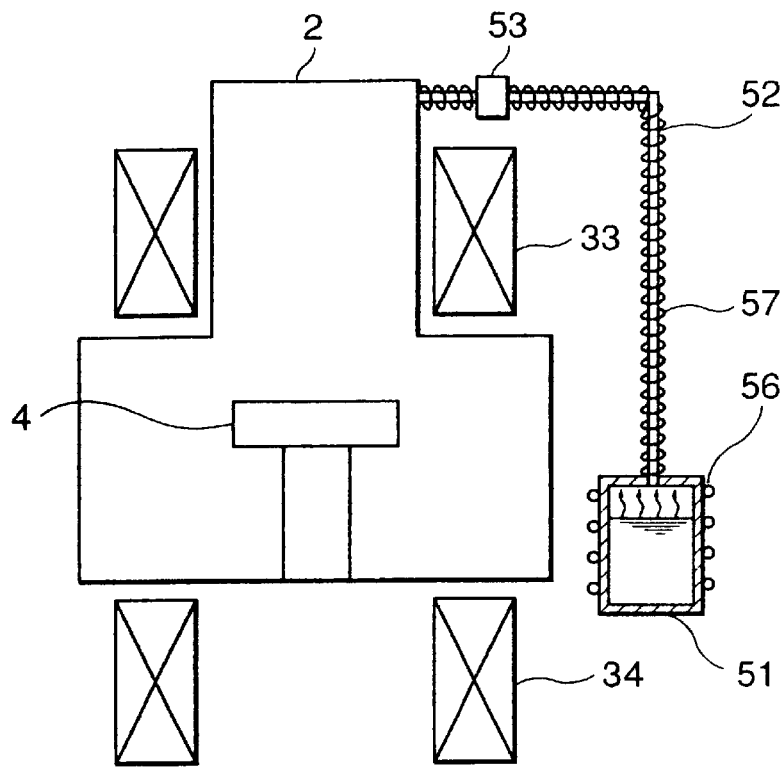
FIG. 10 is a sectional view of another embodiment of a plasma treatment system, in which another preferred embodiment of a cleaning according to the present invention is carried out.

A plasma treatment system shown in FIG. 10 is also designed to introduce $H_2O$ in a gas state. This plasma treatment system includes a heater 56, provided around, e.g., an $H_2O$ container 51, for heating $H_2O$ in the $H_2O$ container 51 to forcibly vaporize $H_2O$ to supply the vaporized $H_2O$ into a plasma chamber 21. In such a plasma treatment chamber, $H_2O$ is supplied to the plasma chamber 21 at a flow rate of, e.g., 100 sccm, to be changed to a plasma to react with C and F of a CF film to carry out the cleaning.

Figure 11:
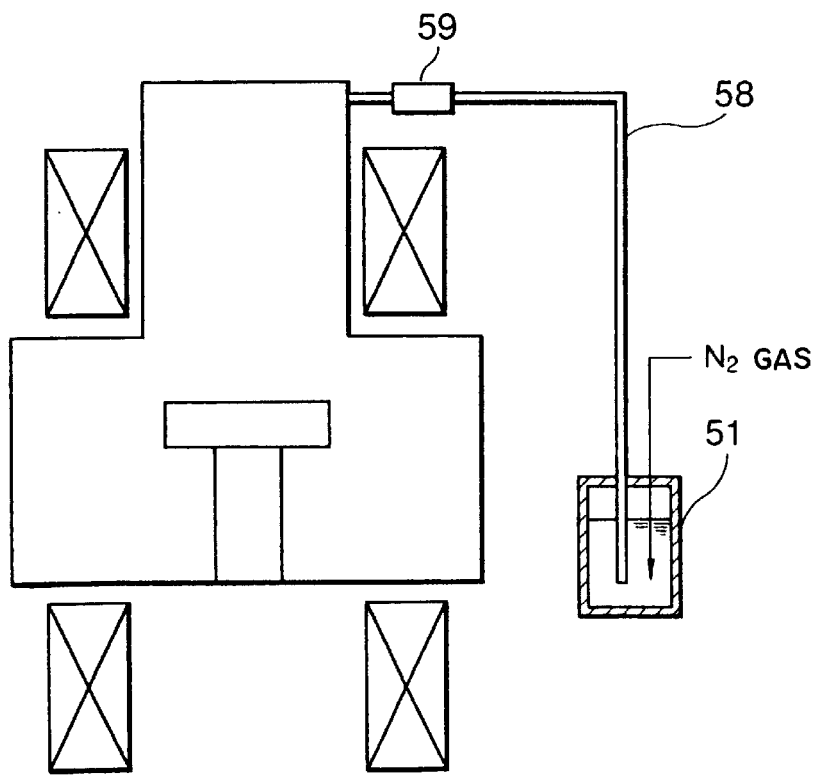
FIG. 11 is a sectional view of another embodiment of a plasma treatment system, in which another preferred embodiment of a cleaning according to the present invention is carried out.

A plasma treatment system shown in FIG. 11 is designed to introduce $H_2O$ in a liquid state. In the drawing, reference number 59 denotes a liquid mass flow. An $H_2O$ container 51 is connected to a plasma chamber 21 via an $H_2O$ supply pipe 58. One end of the $H_2O$ supply pipe 58 on the side of the $H_2O$ container 51 is arranged so as to be submerged in $H_2O$ in the $H_2O$ container 51. The interior of the $H_2O$ container 51 is pressurized by, e.g., $N_2$ gas, so that $H_2O$ in a liquid state is supplied into the plasma chamber 21 via the $H_2O$ supply pipe 58 at a flow rate of, e.g., 0.01 sccm. Since the pressure in the plasma chamber 21 is, e.g., about 0.2 Pa, the $H_2O$ in a liquid state is vaporized immediately after being supplied into the plasma chamber 21, and changed to a plasma therein to react with C and F of a CF film to carry out the cleaning.

An example of experiment, which was carried out by the inventors, will be described below. As an experimental system, the plasma treatment system shown in FIG. 10 was used. At a pressure of 500 Pa at a microwave power of 2500 W in a divergent field, $O_2$ gas and Ar gas serving as plasma gases were supplied at flow rates of 200 sccm and 150 sccm, respectively, and $H_2O$ in a gas state was supplied at various flow rates to etch a wafer W, on which a CF film had been formed. In this case, an etch rate was calculated to derive the amount of the removed CF film. These results are shown in FIG. 12.

Figure 12:
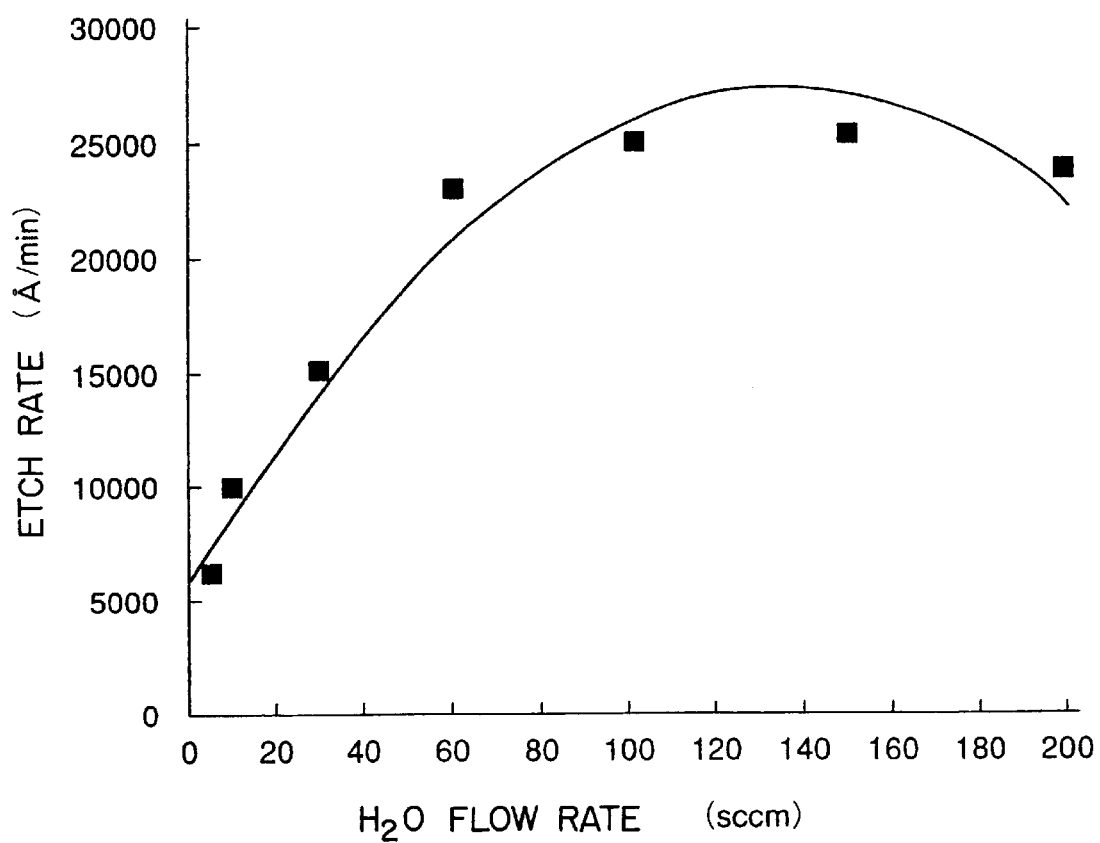
FIG. 12 is a characteristic diagram of an etching for a CF film with $H_2O$ gas.
Figure 15:
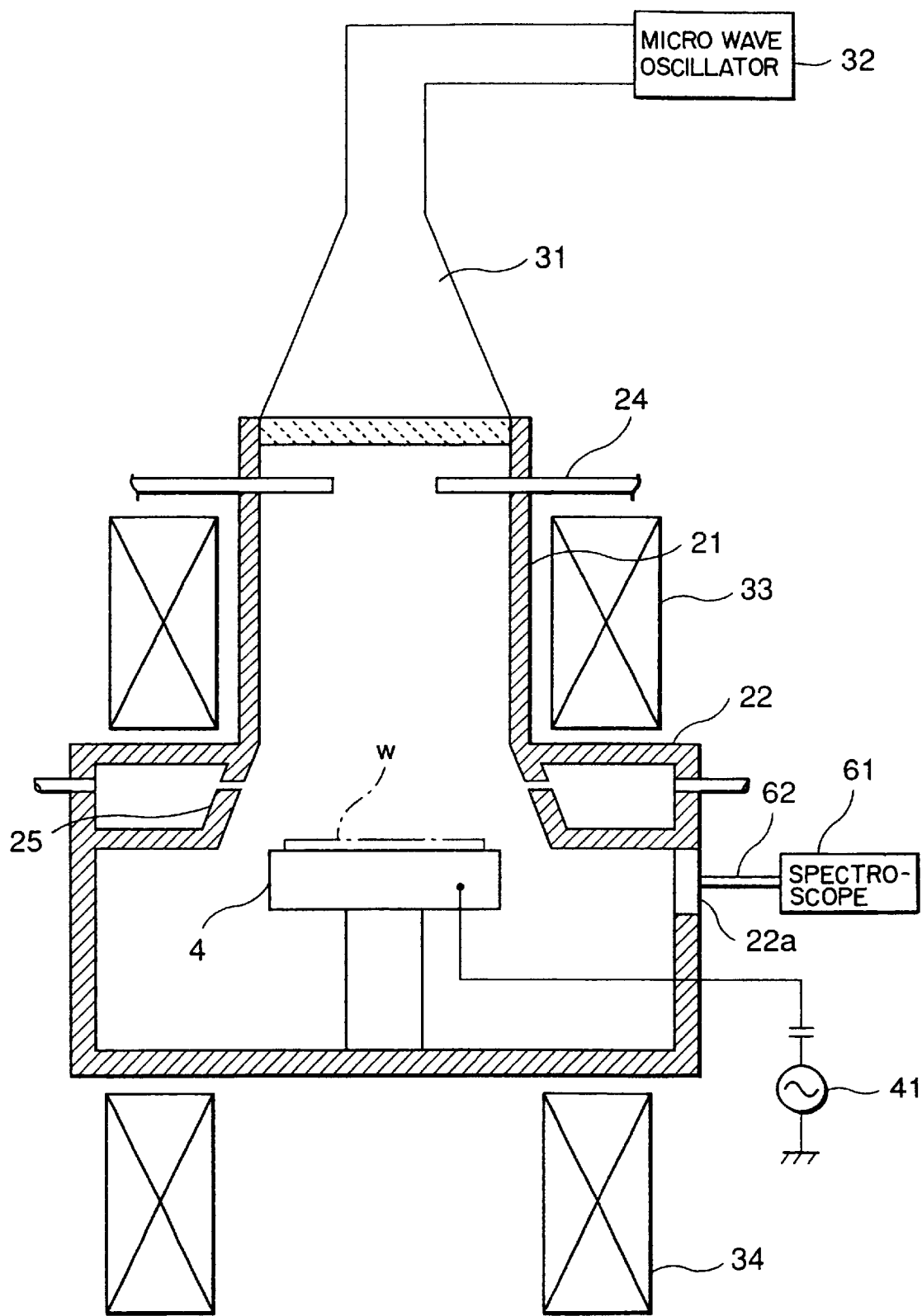
FIG. 15 is a sectional view of another preferred embodiment of a plasma treatment system according to the present invention.

From the results of FIG. 12, it can be seen that when the flow rate of the $H_2O$ increases, the etch rate increases in accordance with the increase of the flow rate until the flow rate reaches 100 sccm, so that the removing rate for the CF film can be increased by the supply of $H_2O$.

Then, in the plasma treatment system shown in FIG. 11, after a CF film having a thickness of 5 μm was deposited on a wafer W having a size of 8 inches at a pressure of 0.2 Pa and at a microwave power of 2700 W, $O_2$ gas and Ar gas serving as plasma gases were supplied at flow rates of 200 sccm and 150 sccm, respectively, at a pressure of 500 Pa, at a microwave power of 2500 W in a divergent field, and $H_2O$ in a gas state was introduced at a flow rate of 60 sccm to carry out the cleaning of the CF film. It was found that the cleaning time was about 5 minutes, so that the cleaning time was shortened in comparison with that in the case where only $O_2$ gas was introduced as a cleaning gas to carry out the cleaning.

Thus, in this preferred embodiment, since $H_2O$ is introduced to carry out the cleaning, the cleaning time of the CF film adhered in the vacuum vessel 2 can be shortened, so that it is possible to improve the throughput in the thin film deposition treatment. In addition, the introducing operation can be easily carried out by introducing $H_2O$, in comparison with the case where $O_2$ gas and $H_2$ gas are separately introduced, and it is convenient for treatment since safe $H_2O$ is used.

Then, another preferred embodiment of the present invention will be described. The difference between this preferred embodiment and the above described preferred embodiment is that $CO_2$ gas, $N_2O$ gas, $N_4O_2$ gas, CO gas or the like was used as a cleaning gas in place of $O_2$ gas.

An example of experiment, which was carried out by the inventors, will be described. As an experimental system, the plasma treatment system shown in FIG. 1 was used. After a CF film having a thickness of 5 $\mu$m was deposited on a wafer W having a size of 8 inches at a microwave power of 2800 W, $CO_2$ gas serving as a cleaning gas was introduced at flow rates of 200 sccm at a pressure of 0.18 Pa, at a microwave power of 2500 W in a divergent field to carry out the cleaning of the CF film adhered in the vacuum vessel 2. The cleaning state was visually observed, and the time required to remove the CF film in the surrounding portions of the gas supply opening 25a and the transfer table 4 was measured. In addition, each of $N_2$, $N_4O_2$, CO and $O_2$ gases was used as a cleaning gas to carry out the same experiments. These results are shown in FIG. 13.

From the results of these experiments, it was found that if $CO_2$, $N_2O$, $N_4O_2$ or CO gas is used as a cleaning gas, the cleaning rate in the surrounding portions of the gas supply opening 25a and the transfer table 4 increases in comparison with that in the case where $O_2$ gas is used, so that the cleaning time can be shortened. It is conceived that the reason why the cleaning rate using $CO_2$, $N_2O$, $N_4O_2$ or CO gas is higher than the cleaning rate using $O_2$ gas is that $CO_2$ and CO gases are easy to react with F of the CF film to form $CF_4$, and $N_2O$ and $N_4O_2$ gases are easy to react with F to form $NF_3$, so that these gases are easier to react with F than $O_2$ gas thereby easily removing the residue of F adhered to the vacuum vessel 2.

Thus, in this preferred embodiment, since $CO_2$, $N_2O$, $N_4O_2$ or CO gas is used as a cleaning gas, the cleaning time for the CF film adhered in the vacuum vessel 2 can be shortened, so that it is possible to improve the throughput in the thin film deposition treatment.

Then, another preferred embodiment of the present invention will be described. The difference between this preferred embodiment and the above described preferred embodiment is that the cleaning is carried out after a cleaning wafer serving as a protective plate for protecting the surface of the transfer table 4 is transferred onto the transfer table 4. The cleaning wafer is made of, e.g., a material, which is not etched by a cleaning gas, e.g., AlN or $Al_2O_3$, and has, e.g., the same size as that of a wafer W, on which a thin film deposition treatment is carried out, e.g., a size of 8 inches. Outside of the vacuum vessel 2, a transport arm (not shown) for carrying the cleaning wafer in and out of the vacuum vessel 2 is provided, and a cleaning wafer cassette (not shown) for transferring the cleaning wafer is provided.

In this preferred embodiment, after the thin film deposition treatment for the wafer W is completed, the wafer W is carried out of the vacuum vessel 2, and the cleaning wafer is removed from the cleaning wafer cassette to be carried in the vacuum vessel 2 to be transferred onto the transfer table 4. While the cleaning wafer is transferred on the surface of the transfer table 4, a predetermined cleaning is carried out.

When the cleaning is thus carried out, the surface of the transfer table 4 is protected by the cleaning wafer, so that the surface of the transfer table 4 is not exposed to a plasma when the cleaning is carried out. Therefore, it is not likely that this surface is struck with the plasma to become rough. In this embodiment, the surface of the transfer table 4 is greater than the outer periphery of the wafer W to be treated, for, e.g., about 2 mm. Although the CF film is adhered to the region projecting from the wafer W when the thin film deposition treatment is carried out, the CF film is not adhered to the region, on which the wafer W is put. Therefore, if the cleaning wafer having the same size as that of the wafer W to be treated is transferred to carry out the cleaning, the region, to which the CF film is not adhered, is protected against the plasma, and the region, to which the CF film is adhered, is exposed to the plasma, so that the adhered CF film is removed. The present invention is effective in the case where the wafer is larger than the transfer table 4.

When the surface of the transfer table 4 becomes rough, irregularities are formed on the surface, so that the thermal conduction onto the wafer W and the absorbing force to the wafer W are partially changed, and the process of the thin film deposition changes between the initial and later stages. However, in this preferred embodiment, since the surface of the transfer table 4 does not become rough as described above, it is possible to prevent the changes in the thermal conduction onto the wafer W and the absorbing force to the wafer W. Therefore, the thickness of the deposited CF film can be uniform, and it is not likely that the reproducibility of the process deteriorates, so that the face-to-face uniformity of the thickness can be improved.

In addition, since the surface of the transfer table 4 does not become rough, it is possible to increase the life of the expensive transfer table 4. Moreover, although the surface of the cleaning is struck with the plasma to become rough, it is likely that particles are produced from the rough surface since the cleaning wafer is made of a material, which is not etched by the cleaning gas.

An example of experiment, which was carried out by the inventors, will be described. As an experimental system, the plasma treatment system shown in FIG. 1 was used. An $SiO_2$ film having a thickness of 1 $\mu$m was deposited on a wafer W having a size of 8 inches at a microwave power of 2300 W. Each time the deposition was carried out for 12 wafers, a cleaning wafer having a size of 8 inches was transferred onto the transfer table, and $NF_3$ gas and $N_2$ gas serving as cleaning gases were introduced at flow rates of 500 sccm, respectively, at a pressure of 200 Pa, at a microwave power of 1200 W in a divergent field to carry out the cleaning for 15 minutes. Thus, the thin film deposition treatment was carried out for 120 wafers, and the temperature of the wafer W and the thickness of the deposited $SiO_2$ film were measured every wafer W. In addition, the same experiments were carried out without transferring the cleaning wafer. The maximum and minimum values of the wafer temperature and the thickness are shown in FIG. 14.

From the results of these experiments, it can be seen that when the cleaning wafer is transferred onto the transfer table, the differences between the maximum and minimum values of the wafer temperature and the thickness are smaller than those in the case where the cleaning wafer is not transferred, so that the uniformity of the thickness in the thin film deposition treatment can be improved by protecting the surface of the transfer table by means of the cleaning wafer. This preferred embodiment can not only be applied to the cleaning of an $SiO_2$ film, but it can be also applied to the cleaning of a CF film and an SiOF film.

Then, another preferred embodiment of the present invention will be described. The difference between this preferred embodiment and the above described preferred embodiment is that a spectroscope 61 for detecting an emission intensity via an optical fiber 62 is provided outside of a peep hole 22a formed in the side wall of a thin film deposition chamber 22, and the finish time of a cleaning is determined by measuring the emission intensity of an active species in the thin film deposition chamber 22. The peep hole 22a is made of a material for transmitting light, e.g., quartz ($SiO_2$) or calcium fluoride ($CaF_2$). The emission intensities of the active species in the thin film deposition chamber 22, e.g., active species, such as O, C and F, are detected by the spectroscope 61. Other constructions are the same as those of the above described plasma treatment system shown in FIG. 1.

Figure 16:
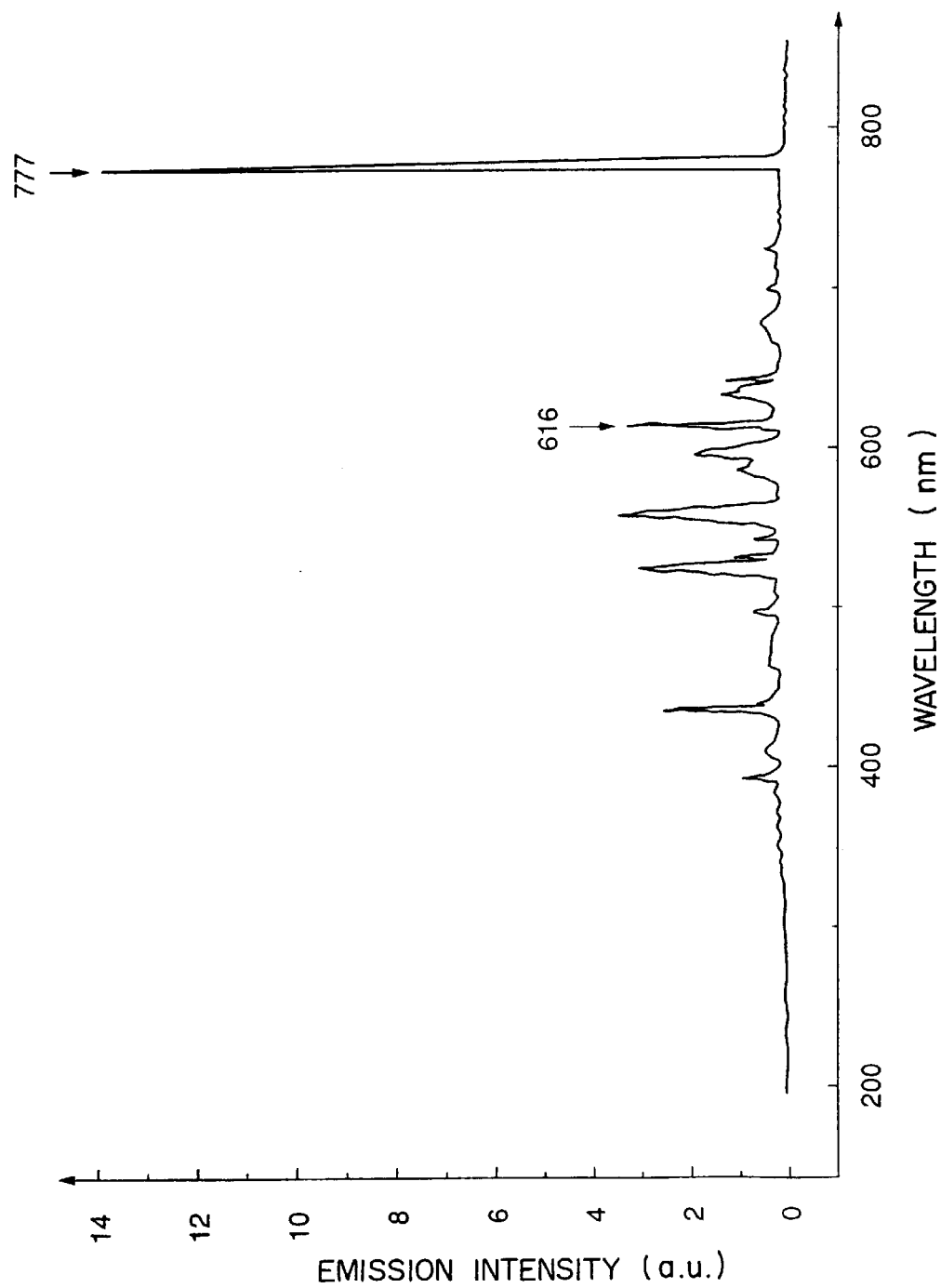
FIG. 16 is a characteristic diagram showing an emission intensity of a plasma of O.

When such a plasma treatment system is applied to the cleaning of a CF film with $O_2$ gas, the function of the system will be described below. When the cleaning is carried out with $O_2$ gas, the emission intensity of the active species of O in the thin film deposition chamber 22 is continuously measured by, e.g., the spectroscope 61. In the thin film deposition chamber 22, there are O, a product formed by the decomposition of the CF film itself and various species (CF, C, $C_2$, CO, $CO_2$, F) produced by the reactions of the CF film with O. When the emission intensity of the active species of O is measured, the active species of O has inherent peaks at wavelengths of, e.g., 777 nm and 616 nm, as shown in FIG. 16. Therefore, if the emission intensity at a wavelength of 777 nm, at which the peak value is maximum, is measured by, e.g., the spectroscope 61, it is possible to selectively detect only the emission intensity of the active species of O. In addition, the emission intensity is in proportion to the amount of O so that the emission intensity increases as the amount of O increases and the emission intensity decreases as the amount of O decreases.

Figure 17:
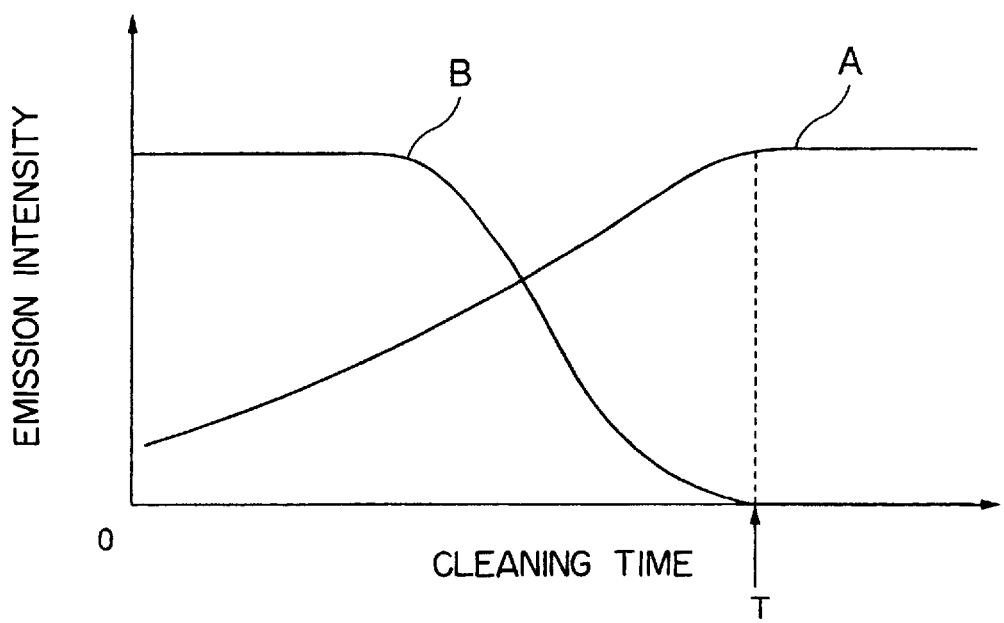
FIG. 17 is a characteristic diagram showing an emission intensity of an active species when cleaning a CF film.

As shown by a curve A in FIG. 17, the emission intensity of the active species of O gradually increases as the cleaning proceeds, and it is substantially constant after time T. That is, the amount that O increases when the cleaning time increases, and it is substantially constant after time T. The reason for this is as follows. A part of the produced active species of O is consumed in the removal of the CF film at the beginning of the cleaning. When the cleaning proceeds to some extent and the residual amount of the CF film decreases, the amount of the active species of O consumed in the removal of the CF film decreases. Therefore, the amount of the active species of O remaining in the thin film deposition chamber 22 increases, and the consumption of the active species of O becomes zero after the CF film is completely removed. Consequently, the produced active species of O remains, and the amount of O is constant. Therefore, the time until the amount of the active species is constant is the time required for the cleaning, and the cleaning ends at this time T.

On the other hand, a curve B in FIG. 17 shows the emission intensity of the active species based on the CF film, e.g., the active species of CF, C, $C_2$, CO, $CO_2$ or F. Contrary to O, this emission intensity gradually decreases as the cleaning proceeds, and it is zero after time T. That is, since a great amount of CF film exists at the beginning of the cleaning, the amount of the above active species is also great. When the cleaning proceeds to some extent and the residual amount of the CF film decreases, the amount of the above active species gradually decreases in accordance therewith, and the amount of the above active species is zero when the CF film is completely removed. Therefore, in this case, the time until the amount of the active species reaches zero is the time required to carry out the cleaning, and the time T is the finish time of the cleaning.

Figure 18:
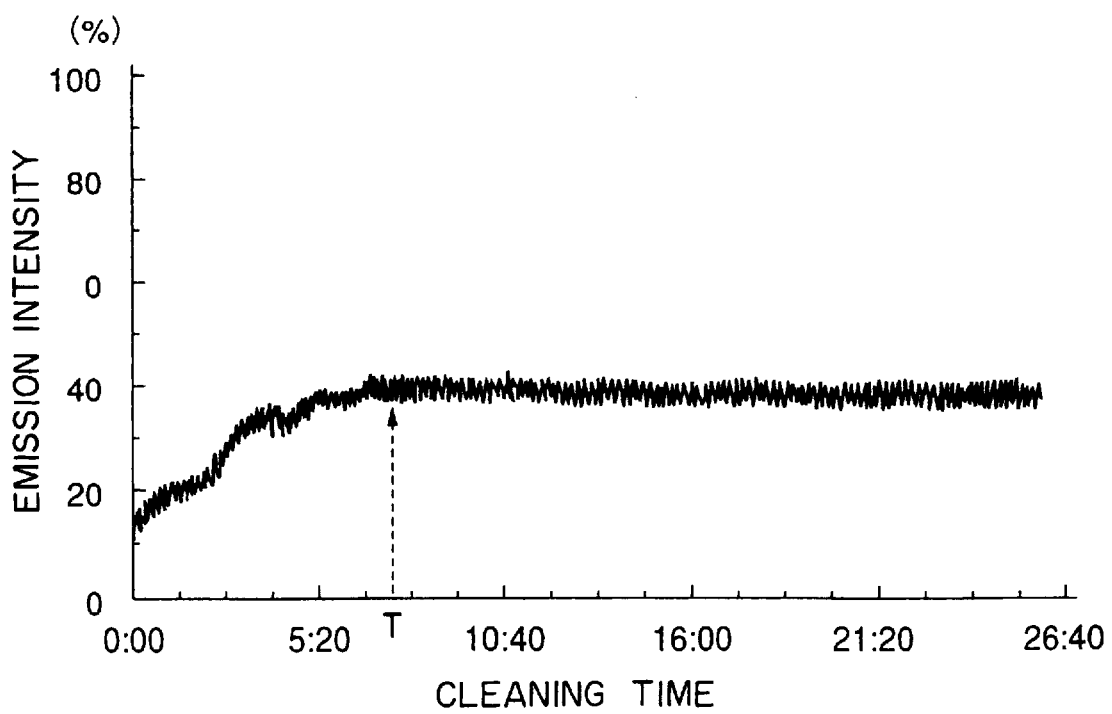
FIG. 18 is a characteristic diagram showing the measured results of an emission intensity of a plasma of O when cleaning a CF film.

FIG. 18 shows the emission intensity of the active species of O at a wavelength of 777 nm, which was measured when the cleaning was carried out. Thus, since the emission intensity of the active species of O gradually increases, the cleaning is completed when the emission intensity is constant. The end point of the cleaning is determined by observing, e.g., the level of the detected value of the emission intensity, and by previously setting a program for causing the emission intensity to be constant when the detected value converges within a predetermined range.

Thus, in the plasma treatment system in this preferred embodiment, the end point of the cleaning is determined by detecting the emission intensity of the active species of O existing in the thin film deposition chamber 22, so that it is possible to more accurately determine the end point than the case where the end point of the cleaning is visually determined. Therefore, it is possible to prevent an error in determination of the end point from being made to prevent the CF film from remaining or to prevent the cleaning from continuing although the CF film has been removed, so that it is possible to improve the throughput in the thin film deposition treatment.

In this preferred embodiment, the end point of the cleaning may be determined by detecting the emission intensity of the active species based on the CF film. Alternatively, when a gas other than $O_2$ gas is used as a cleaning gas, the emission intensity of the active species of this gas may be detected. In addition, this preferred embodiment can not be applied only to the cleaning of the CF film formed by the ECR plasma treatment, but it can be also applied to the cleaning of the CF film formed by plasma. Moreover, this preferred embodiment can be applied to the cleaning of the $SiO_2$ film and the SiOF film.

According to the present invention, it is possible to shorten the time required to carry out the cleaning of a fluorine containing carbon film adhered in a vacuum vessel, and to protect the surface of a transfer table when the cleaning is carried out.

A plasma treatment method, which is carried out by the system shown in FIG. 1, will be described below.

First, a thin film deposition process for a CF film will be described. A wafer W, on the surface of which an interconnection layer of, e.g., aluminum, has been formed, is introduced from a load-lock chamber (not shown) to be transferred onto the transfer table 4. Subsequently, the interior of the vacuum vessel 2 is evacuated to a predetermined degree of vacuum, and a plasma gas, e.g., Ar gas, is introduced from the plasma gas nozzles 24 into the plasma chamber 21 at a flow rate of 150 sccm as well as thin film deposition gases, e.g., $C_4F_8$ gas and $C_2H_4$ gas, are introduced from the gas ring 25 into the thin film deposition chamber 22 at flow rates of 60 sccm and 30 sccm, respectively. Then, the pressure in the vacuum vessel 2 is maintained to be a process pressure of, e.g., 0.2 Pa, and a bias voltage of 13.45 MHz and 1500 W is applied to the transfer table 4 while the surface temperature of the transfer table 4 is set to be 320° C.

A high frequency wave (a microwave) of 2.45 GHz produced by the microwave oscillator 32 is carried in the waveguide 31 to be introduced into the plasma chamber 21 via the transmission window 23. In the plasma chamber 21, a mirror field produced by the main coil 33 and the sub-coil 34 is applied at a magnitude of 875 gausses. The interaction between the magnetic field and the microwave causes the electron cyclotron resonance to produce a plasma of Ar gas and to increase the density thereof.

The plasma flow, which has flowed into the thin film deposition chamber 22 from the plasma chamber 21, activates (produces plasmas of) the $C_4F_8$ gas and $C_2H_4$ gas supplied therein, to form active species (plasmas). On the other hand, the active species transported onto the wafer W are deposited as a CF film. At this time, Ar ions, which are drawn into the wafer W by the plasma drawing bias voltage, chip off the CF film, which has been deposited at the corners on the pattern on the surface of the wafer W, by the sputter etching function, and deposit the CF film from the bottom of the pattern grove while expanding the frontage thereof so that the CF film is embedded into a recessed portion without producing voids.

Then, a cleaning process, which is carried out after the thin film deposition treatment, will be described. If a predetermined thin film deposition treatment is carried out for the wafer W, the CF film is also adhered to portions wherein the thin film deposition gas reaches, e.g., to the surrounding portion of the wafer W on the surface of the transfer table 4, the outer periphery portion of the transfer table 4 and the surrounding portion of the gas supply opening 25a. The cleaning is a treatment for removing the CF film adhered in the vacuum vessel 2, and carried out after the thin film deposition treatment for, e.g., 12 wafers W, is completed.

Specifically, after the twelfth wafer W is carried out of the vacuum vessel 2, a cleaning gas, e.g., $O_2$ gas is introduced from the plasma gas nozzles 24 into the plasma chamber 21 at a flow rate of, e.g., 200 sccm, and a micro wave of 2.45 GHz is introduced from the microwave oscillator 32 while a magnetic field having a magnitude of, e.g., 875 gausses is applied by operating, e.g., the main coil 33.

Thus, an electron cyclotron resonance occurs in the thin film deposition chamber 2 by the interaction between the magnetic field and the microwave to produce a plasma of $O_2$ gas and to increase the density thereof. The active species of O thus produced, which comprises O radicals and ions, reacts with the CF film, which has been adhered to the surrounding portions of the gas supply opening 25a and the transfer table 4, to decompose the CF film into, e.g., $CO_2$ gas and $F_2$ gas, to scatter and discharge them to the outside of the thin film deposition chamber 22 via an exhaust port (not shown).

Then, a precoat process serving as a pretreatment thin film deposition process, which is carried out after the cleaning process, will be described. In the precoat process, a precoat film is deposited on the inner wall of the vacuum vessel 2. Specifically, after the cleaning is completed, CF gases, e.g., $C_4F_8$ gas and $C_2H_4$ gas, serving as precoat gases are introduced from the gas ring 25 into the plasma chamber 21 at flow rates of 60 sccm and 30 sccm, respectively, and a plasma gas, e.g., Ar gas, is introduced from the plasma gas nozzles 24 into the plasma chamber 21 at a flow rate of 150 sccm. In addition, a microwave of 2.45 GHz is introduced into the microwave oscillator 32 into the plasma chamber 21, and a magnetic field is applied at a magnitude of 875 gausses by operating, e.g., the main coil 33. Thus, the precoat process is carried out.

Thus, an electron cyclotron resonance occurs in the thin film deposition chamber 2 by the interaction between the magnetic field and the microwave to produce a plasma of the plasma gas and to increase the density thereof. The plasma flow, which has flowed into the thin film deposition chamber 22 from the plasma chamber 21, activates the precoat gas supplied therein, to form active species, by which a precoat film of a CF film having a thickness of, e.g., 2 μm, is deposited on the inner wall of the vacuum vessel 2 as a thin film for preventing particles from being produced.

After the precoat process is thus carried out, the wafer W is carried in the vacuum vessel 2 to be transferred onto the transfer table 4, and the above described thin film deposition process for the CF film is carried out.

Figure 19:
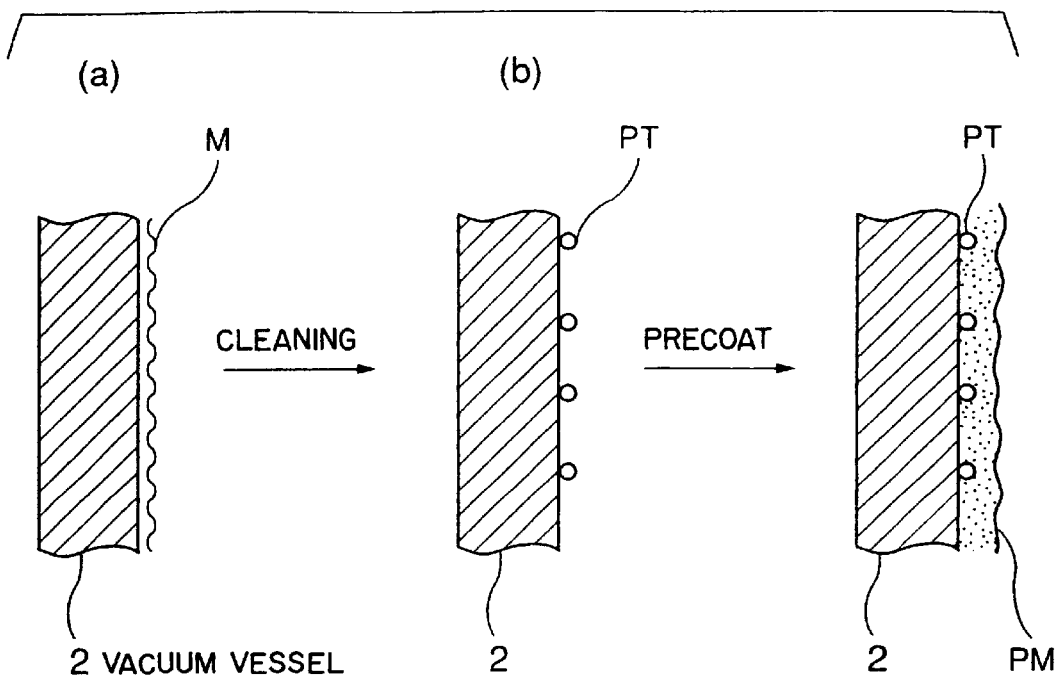
FIG. 19 is a schematic diagram for explaining the function of the preferred embodiment of the present invention.

In this preferred embodiment, since the precoat process is carried out with a CF gas after the cleaning process is carried out, the following advantages can be obtained. First, it is possible to prevent particles from scattering when the thin film deposition treatment is carried out. That is, when the cleaning is carried out, most of the CF film M adhered to the inner wall of the vacuum vessel 2 is removed while a small amount of particles PT remain on the inner surface as shown in FIGS. 19(a) and 19(b). Because there is a residual part of the CF film M which has not been removed by the cleaning, or aluminum and/or nitrogen can not be removed by the cleaning when the CF film M containing aluminum and/or nitrogen is originally adhered to the inner wall of the vacuum vessel 2.

Figure 20:
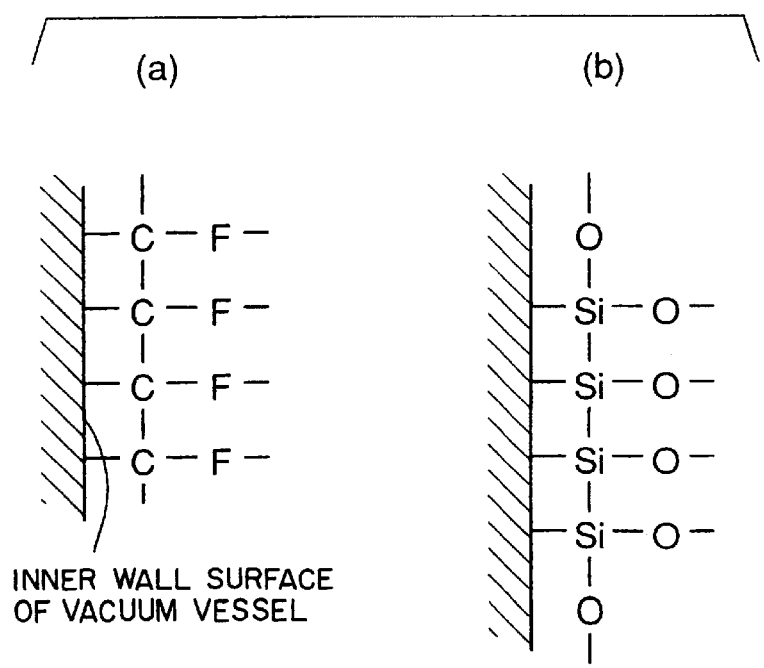
FIG. 20 is a schematic diagram for explaining the function of the preferred embodiment of the present invention.

In such a case, if the precoat is carried out, the precoat film PM is formed on the inner wall surface of the vacuum vessel 2 so as to confine particles PT, so that it is possible to prevent particles from scattering when the subsequent thin film deposition treatment for the CF film is carried out. That is, in this preferred embodiment, the precoat film has a similar composition to that of the CF film formed on the wafer W. For example, the precoat film is formed on the inner wall surface of the vacuum vessel 2 as shown in FIG. 20(a).

As described above, since this precoat film has a similar composition to that of the deposited CF film, it is not likely that the precoat film reacts with the thin film deposition gas when the thin film deposition treatment is carried out. Therefore, it is possible to inhibit the thin film deposition gas and the precoat film PM from reacting with each other to produce particles when the thin film deposition treatment is carried out, and it is possible to inhibit the precoat film from being removed to inhibit the particles PT adhered to the inner wall surface from scattering. On the other hand, if the precoat film is formed of, e.g., an $SiO_2$ film (see FIG. 20(b)), this film is easy to react with a CF gas, which is the thin film deposition gas for the CF film, when the thin film deposition treatment is carried out, so that particles are easily produced.

Secondly, when the thin film deposition treatment is carried out, the quality of the CF film formed on the wafer W can be uniform in the depth directions. That is, when the thin film deposition treatment is carried out immediately after the cleaning is completed, the CF film is deposited on the inner wall surface of the vacuum vessel 2 of aluminum at the initial stage of the treatment, so that the thin film deposition gas, which is easy to react with aluminum, is consumed. Therefore, since the flow ratio of $C_4F_8$ gas to $C_2H_4$ gas changes so that the composition of the thin film deposition gas changes, the quality of the CF film formed on the wafer W, particularly the quality thereof in the depth directions, changes between the initial stage and subsequent stage in the treatment.

On the other hand, if the precoat process is carried out after the cleaning is completed, the precoat film of the CF film is previously formed on the inner wall of the vacuum vessel 2 in this process, so that the CF film is formed on the upper surface of the precoat film when the thin film deposition treatment is carried out. However, when the CF film is thus formed on the upper surface of the precoat film, it is conceived that the thin film deposition gas is consumed similarly when the CF film is deposited on the surface of the precoat film and when the CF film is deposited on the wafer W, since the precoat film itself has a similar composition to that of the CF film deposited on the wafer W. Therefore, since it is not likely that the flow ratio of $C_4F_8$ gas to $C_2H_4$ gas changes unlike the thin film deposition on the surface of aluminum, the composition of the thin film deposition gas does not change between the initial stage and subsequent stage in the treatment, so that the quality of the CF film formed on the wafer W, particularly the quality of the CF film in the depth directions thereof, can be uniform.

Thirdly, when the thin film deposition treatment is carried out, it is possible to prevent the CF film deposited on the inner wall surface of the vacuum vessel 2 from being peeled off. That is, when the thin film deposition treatment is carried out after the cleaning is completed, the CF film M is deposited on the inner wall surface of the vacuum vessel 2 as described above. However, since the adhesion between the inner wall surface of aluminum and the CF film M is bad, there are some cases where the CF film M is peeled from the inner wall surface when the treatment proceeds and the amount of the adhered CF film M increases. If the CF film M is thus peeled off, particles are produced, and particles PT originally adhered to the inner wall surface appear to scatter.

On the other hand, if the precoat process is carried out after the cleaning is completed, the precoat film of the CF film is previously formed on the inner wall of the vacuum vessel 2 in this process, and the CF film is formed on the upper surface of the precoat film when the thin film deposition treatment is carried out. In this case, the precoat conditions are different from the thin film deposition conditions, so that the qualities of the formed films are different. Therefore, even if the precoat film is formed on the inner wall surface of the vacuum vessel 2 of aluminum when the precoat is carried out, the adhesion of the precoat film to aluminum is greater than that of the CF film deposited on the inner wall surface when the thin film deposition treatment is carried out. In addition, although the CF film is deposited on the upper surface of the precoat film when the thin film deposition treatment is carried out, it is not likely that the CF film is peeled from the precoat film since the adhesion of the precoat film to the CF film is great. Thus, since it is possible to inhibit the film from being peeled off if the precoat is carried out, it is possible to inhibit particles causing the film peel from being produced.

An example of experiment, which was carried out to verify the advantages in this preferred embodiment, will be described. As an experimental system, the plasma treatment system shown in FIG. 1 was used. A microwave power of 2700 W and a pressure of 0.2 Pa were applied to the plasma treatment system, and no high frequency power was applied thereto. On these conditions, $C_4F_8$ gas and $C_2H_4$ gas serving as precoat gases were introduced at flow rates of 60 sccm and 30 sccm, respectively, and Ar gas serving as a plasma gas was introduced at a flow rate of 150 sccm, to form a precoat film PM having a thickness of 2 $\mu$m.

Thereafter, while applying a microwave power of 2700 W, a high frequency power of 1500 W and a pressure of 0.2 Pa, $C_4F_8$ gas and $C_2H_4$ gas serving as thin film deposition gases were introduced at flow rates of 60 sccm and 30 sccm, respectively, and Ar gas serving as a plasma gas was introduced at a flow rate of 150 sccm, to deposit a CF film having a thickness of 0.5 $\mu$m on a wafer W having a size of 8 inches. Then, the uniformity of the CF film formed on the wafer W in the depth directions was measured by the XPS analysis (X-ray Photo Spectroscopy). In addition, a CF film was formed on a wafer W in the same conditions when no precoat was carried out, and the XPS analysis thereof was carried out. These results are shown in FIGS. 21 and 22, respectively.

Figure 21:
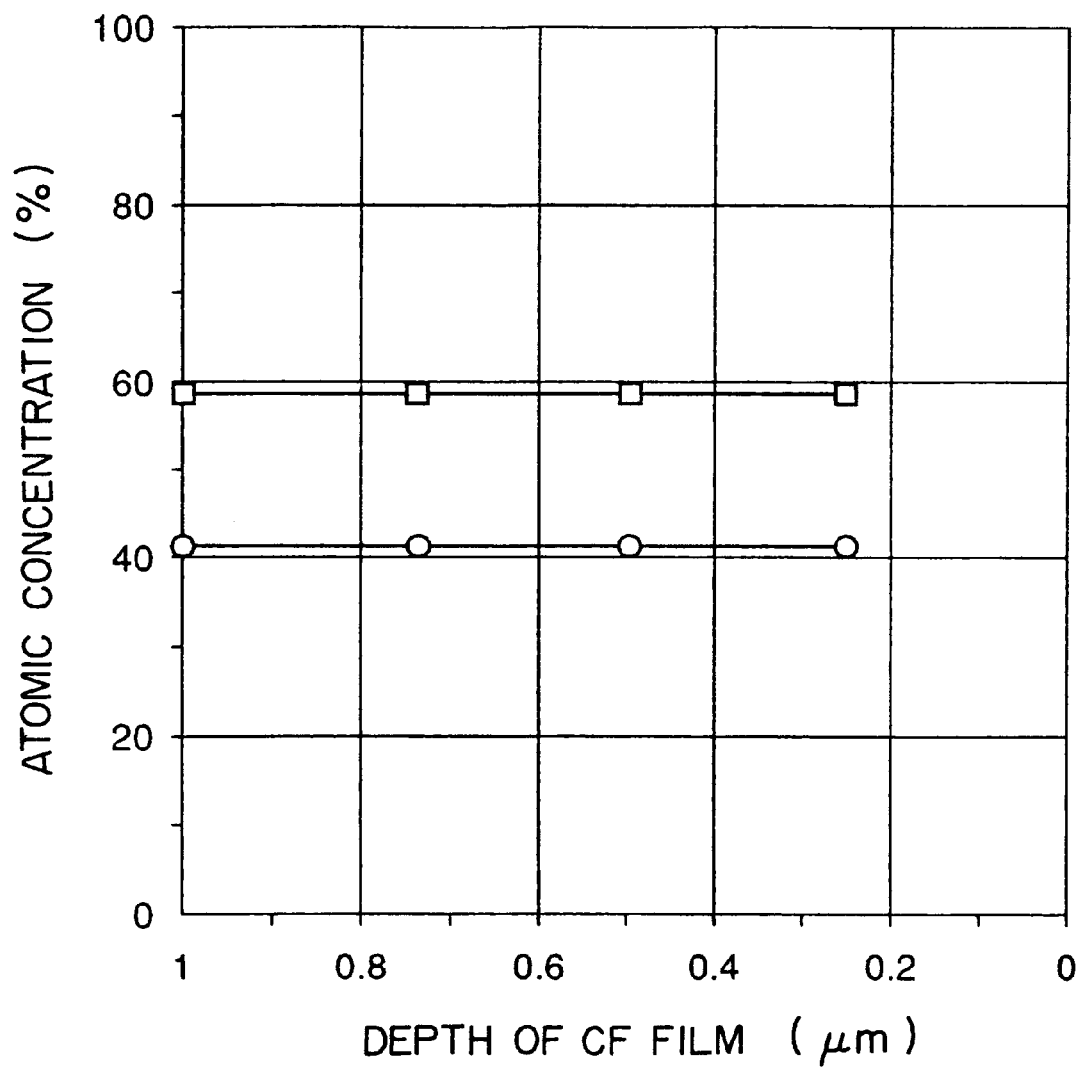
FIG. 21 is a characteristic diagram showing the relationship between the atomic concentration and the depth of a CF film for showing the results of an example of an experiment carried out for verifying the advantages of the preferred embodiment of the present invention.
Figure 22:
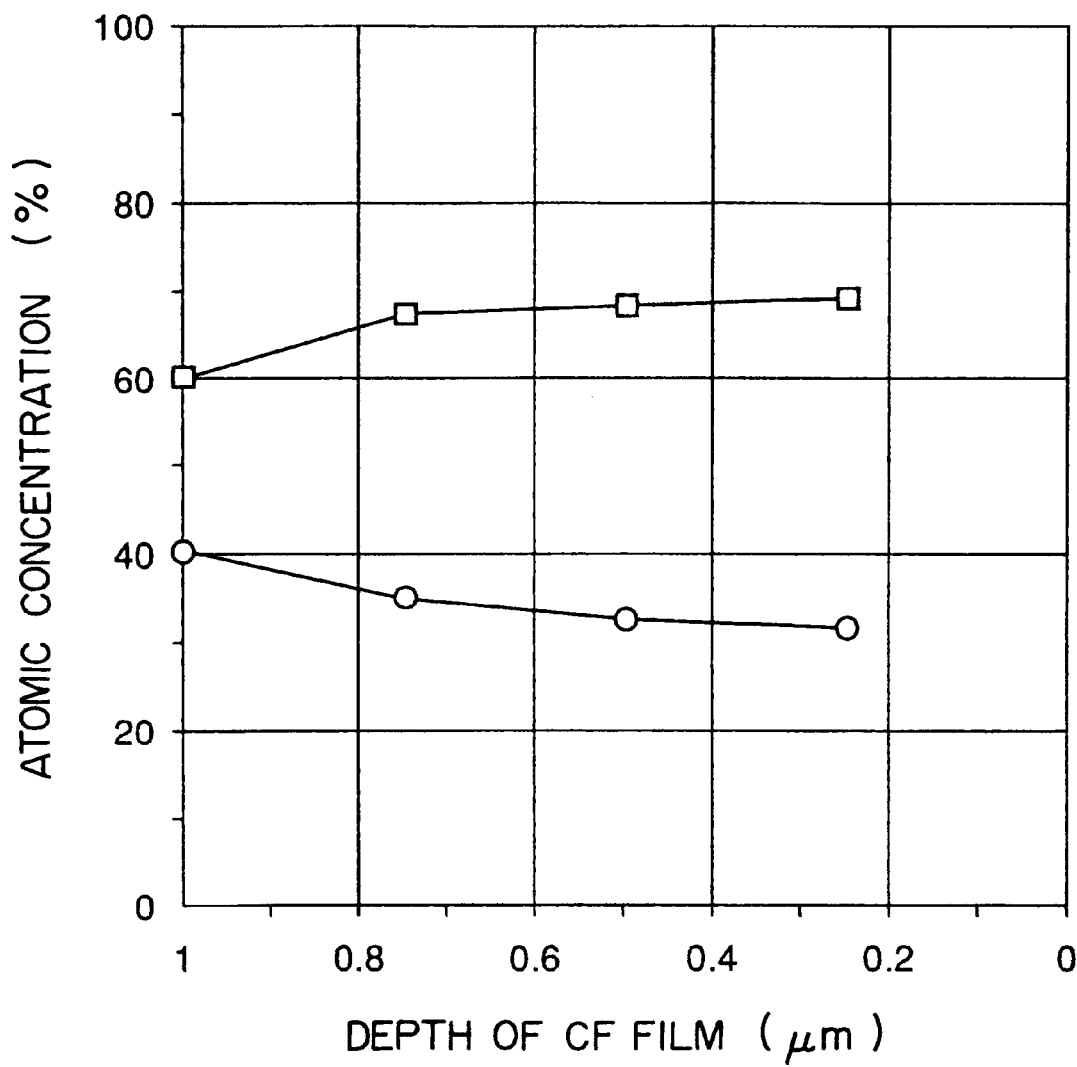
FIG. 22 is a characteristic diagram showing the relationship between the atomic concentration and the depth of a CF film for showing the results of an example of an experiment carried out for verifying the advantages of the preferred embodiment of the present invention.

In FIGS. 21 and 22, the atomic concentrations of C (carbon) and F (fluorine) of 1S orbital in the CF film in the depth directions of the CF film are indicated by □ and ⊖. respectively. In the drawings, the depth of the CF' film is "1" at the uppermost surface, and the depth of the CF film increases as it approaches "0". From these results, it can been seen that when no precoat is carried out (see FIG. 22), the concentration of C increases and the concentration of F decreases as the depth of the CF film increases, whereas when the precoat is carried out, the concentrations of C and F in the CF film are constant even if the depth of the CF film increases. Thus, it was found that the uniformity of the CF film in the depth directions was improved when the precoat was carried out (see FIG. 21).

Then, after the precoat was carried out on the same conditions as those of the above experiments, a CF film was deposited on each of 12 wafers W in the same conditions as those of the above experiments, and the amount of particles having a size of 0.25 $\mu$m or more existing on each of the wafers W was measured by a dust particle inspection system for wafers. In addition, when no precoat was carried out, the thin film deposition treatment for each of the wafers W was carried out in the similar manner, and the amount of particles was measured. These results are shown in FIGS. 23 and 24.

Figure 23:
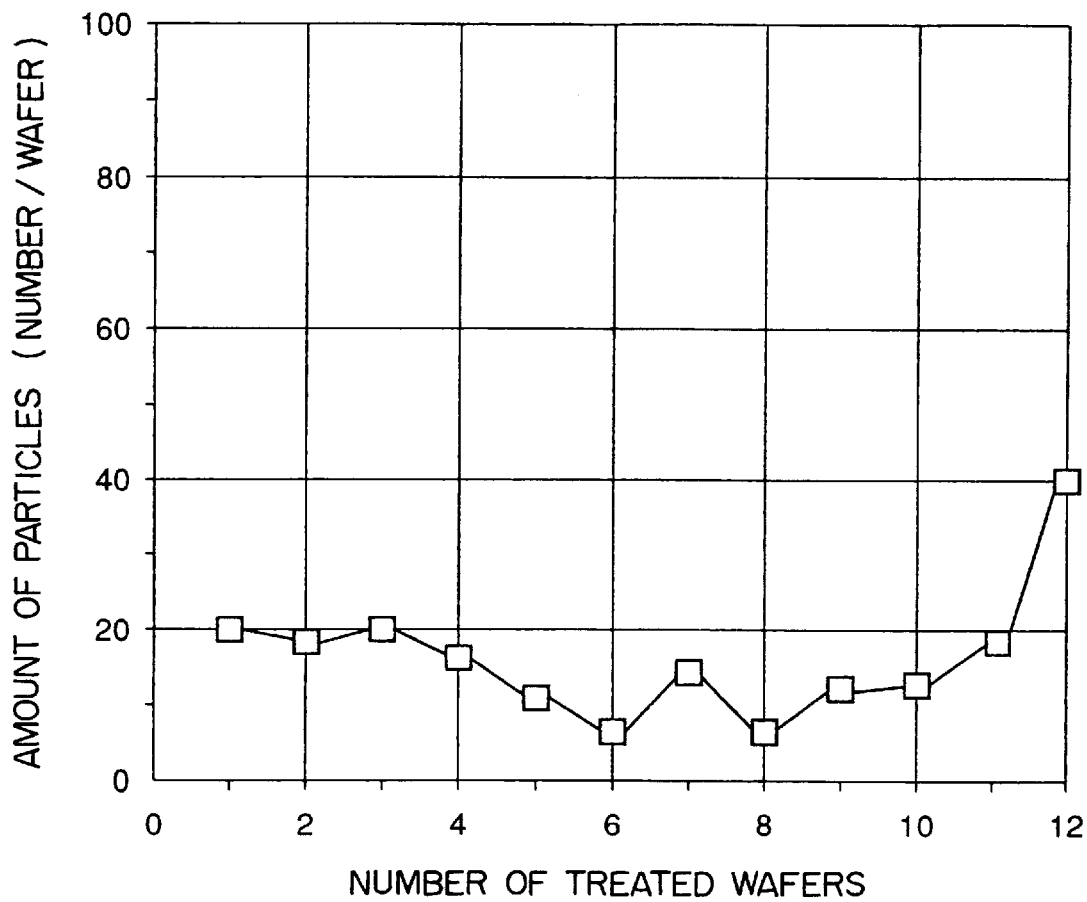
FIG. 23 is a characteristic diagram showing the relationship between the quantity of particles and the number of treated wafers for showing the results of an example of an experiment carried out for verifying the advantages of the preferred embodiment of the present invention.
Figure 24:
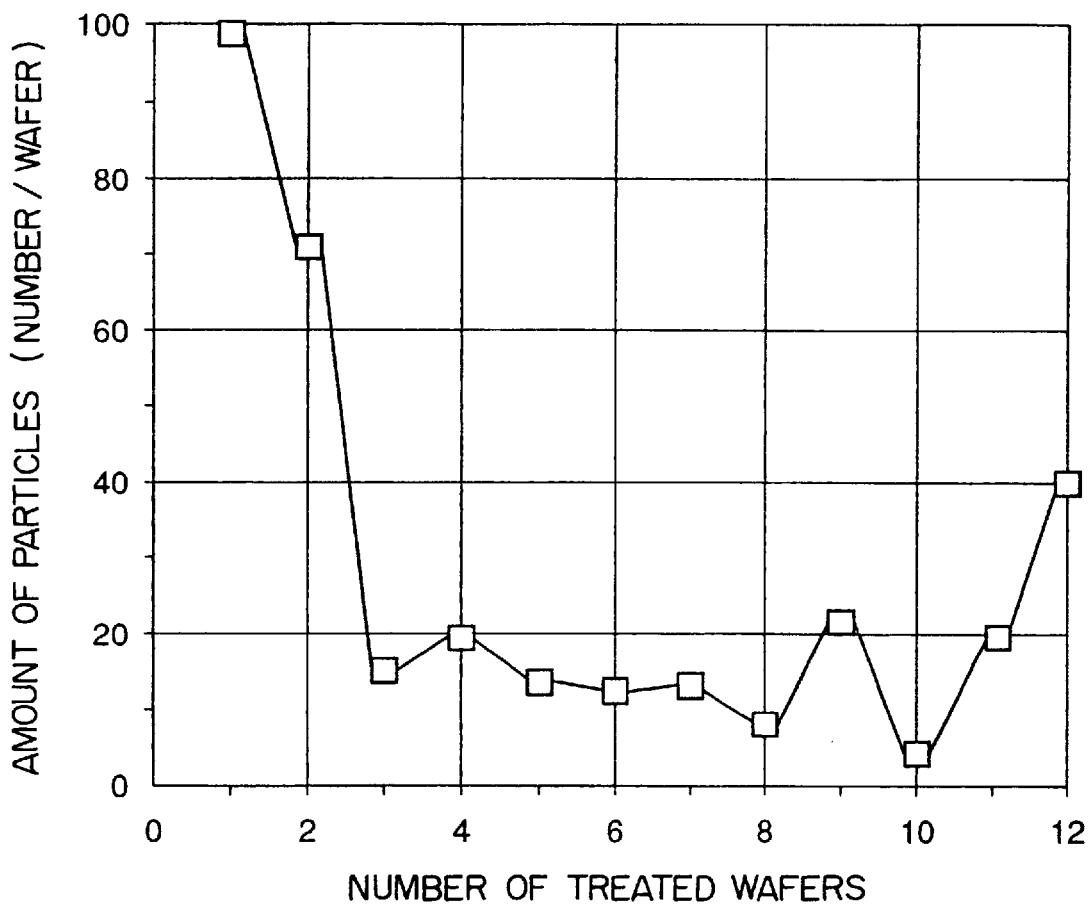
FIG. 24 is a characteristic diagram showing the relationship between the quantity of particles and the number of treated wafers for showing the results of an example of an experiment carried out for verifying the advantages of the preferred embodiment of the present invention.

In FIGS. 23 and 24, the axis of abscissas denotes the number of treated wafers W. From these results, it can be seen that when the precoat is carried out, the amount of particles is very small up to the second wafer W in comparison with that in the case where no precoat is carried out. Thus, it was found that the amount of produced particles was extremely decreased when the precoat was carried out.

Thus, in this preferred embodiment, it is possible to reduce the amount of particles in the vacuum vessel 2, so that it is possible to carry out a stable treatment for the substrate to be treated, in the subsequent thin film deposition process.

Then, another preferred embodiment of the present invention will be described. The difference between this preferred embodiment and the above described preferred embodiment is that, as a precoat gas, a gas having a double bond or a triplet bond, e.g., $C_2F_2$ gas or $C_2F_4$ gas, or a gas having a molecular structure having four CF groups bonded to one C, e.g., $C(CF_3)_4C$ gas or $C(C_2F_5)_4$ gas, is used. If such a gas is used as a precoat gas, there is an advantage in that the amount of produced particles decreases.

An example of experiment, which was carried out to verify the advantages in this preferred embodiment, will be described. As an experimental system, the plasma treatment system shown in FIG. 1 was used. A microwave power of 2700 W and a pressure of 0.2 Pa were applied to the plasma treatment system, and no high frequency power was applied thereto. On these conditions, $C_2F_4$ gas serving as a precoat gas was introduced at a flow rate of 60 sccm, and Ar gas serving as a plasma gas was introduced at a flow rate of 200 sccm, to form a precoat film PM having a thickness of 2 μm.

Thereafter, while applying a microwave power 2700 W, a high frequency power of 1500 W and a pressure of 0.2 Pa, $C_4F_8$ gas and $C_2H_4$ gas serving as thin film deposition gases were introduced at flow rates of 60 sccm and 30 sccm, respectively, and Ar gas serving as a plasma gas was introduced at a flow rate of 150 sccm, to deposit a CF film having a thickness of 0.25 μm on a wafer W having a size of 8 inches. This thin film deposition treatment was carried out for 60 wafers W, and the amount of particles having a size of 0.25 μm or more existing on each of the wafers W was measured by a dust particle inspection system for wafers.

In addition, while applying a microwave power of 2000 W, a high frequency power of 2000 W and a pressure of 0.3 Pa, $SiH_4$ gas serving as a precoat gas was introduced at a flow rate of 80 sccm, and $O_2$ gas and Ar gas serving as plasma gases were introduced at flow rates of 100 sccm and 200 sccm, respectively, so that an $SiO_2$ film serving as a precoat film was formed so as to have a thickness of 1.0 μm. This thin film deposition treatment was carried out for the wafer W, and the amount of particles was measured in the similar manner. These results are shown in FIG. 25.

Figure 25:
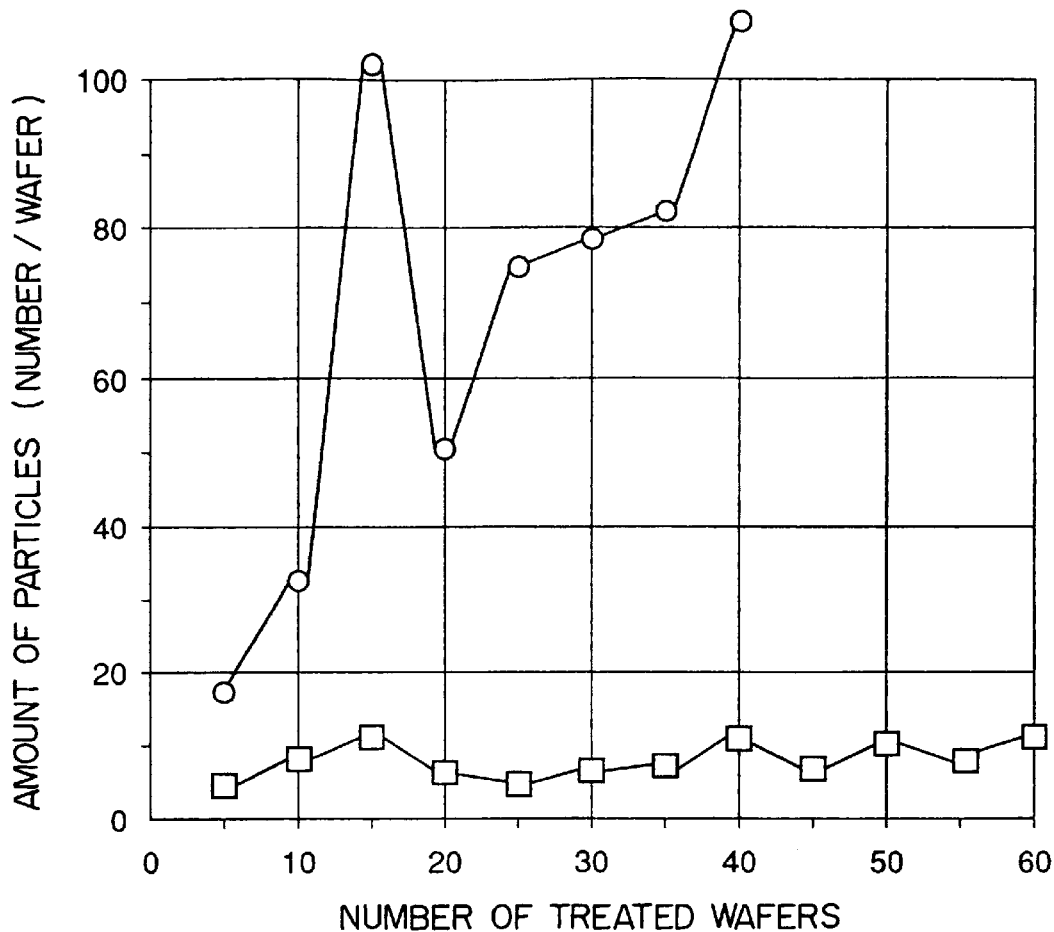
FIG. 25 is a characteristic diagram showing the relationship between the quantity of particles and the number of treated wafers for showing the results of an example of an experiment carried out for verifying the advantages of another preferred embodiment of the present invention.
Figure 26:
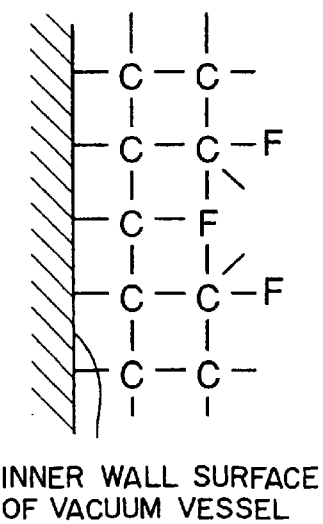
FIG. 26 a schematic diagram for explaining the function of another preferred embodiment of the present invention.

In FIG. 25, the axis of abscissas denotes the number of treated wafers W. From these results, it can be seen that when the precoat is carried out with $C_2F_4$ gas (shown by □ in the drawing), the amount of particles is far smaller than that in the case where a precoat of $SiO_2$ film is carried out by introducing $SiH_4$ gas (shown by ○ in the drawing).

It is conceived that the reason for this is as follows. That is, when a precoat of $SiO_2$ is formed, the precoat film is easy to react with the thin film deposition gas as described above, so that this reaction produces particles. In addition, the precoat film is peeled from the inner wall surface of the vacuum vessel 2 to cause particles. Moreover, the precoat film is removed, so that the particles adhered to the inner wall surface scatter. Thus, the amount of particles increases.

On the other hand, when the precoat is carried out with $C_2F_4$ gas, the C—C bond of the precoat film is formed as a three-dimensional network, i.e., a three-dimensional network structure of C—C is formed, so that the precoat film is compact and strong. Therefore, although the precoat film is originally difficult to react with the thin film deposition gas as described above, it is more difficult to react therewith when the film has the network structure of C—C. As a result, the production of particles based on the reaction of the precoat film with the thin film deposition gas is inhibited.

In addition, the adhesion of the CF film tends to increase when the amount of C increases. Since the amount of C increases in the above described network structure, the adhesion of the precoat film to the inner wall surface of the vacuum vessel 2 increases. Therefore, since the precoat film is difficult to be peeled from the inner wall surface of the vacuum vessel 2, it is conceived that the production of particles based on the film peel is inhibited. Therefore, it is suspected that when the precoat is carried out with $C_2F_4$ gas, the production of particles can be drastically decreased by the synergistic effect of them.

Thus, in this preferred embodiment, the amount of particles in the vacuum vessel 2 can be drastically decreased, so that it is possible to carry out a stable treatment on a substrate to be treated, in the subsequent thin film deposition process.

Then, another preferred embodiment of the present invention will be described. The difference between this preferred embodiment and the above described preferred embodiment is that the precoat film is made of a-C:H film (amorphous carbon hydride, which will be hereinafter referred to as "a-C film"). In this case, a-C film is formed by using $C_kH_s$ (k, s: integer) alone or $C_kH_s$ gas+$H_2$ gas as a precoat gas. Thus, when a-C film is used as the precoat film, there are advantages in that the adhesion of the precoat film to the inner wall surface of the vacuum vessel 2 increases, and the amount of produced particles decreases.

An example of experiment, which was carried out to verify the advantages in this preferred embodiment, will be described. As an experimental system, the plasma treatment system shown in FIG. 1 was used. A microwave power of 2500 W and a pressure of 0.3 Pa were applied to the plasma treatment system, and no high frequency power was applied thereto. On these conditions, $C_2H_4$ gas serving as a precoat gas was introduced at a flow rate of 100 sccm, and Ar gas serving as a plasma gas was introduced at a flow rate of 300 sccm, to form a precoat film PM having a thickness of 2 μm.

Thereafter, while applying a microwave power 1500 W, a high frequency power of 1500 W and a pressure of 0.2 Pa, $C_4F_8$ gas and $C_2H_4$ gas serving as thin film deposition gases were introduced at flow rates of 60 sccm and 30 sccm, respectively, and Ar gas serving as a plasma gas was introduced at a flow rate of 150 sccm, to deposit a CF film having a thickness of 0.25 μm on a wafer W having a size of 8 inches. This thin film deposition treatment was carried out for 40 wafers W, and the amount of particles having a size of 0.25 μm or more existing on each of the wafers W was measured by a dust particle inspection system for wafers.

In addition, while applying a microwave power of 2000 W, a high frequency power of 2000 W and a pressure of 0.3 Pa, $SiH_4$ gas serving as a precoat gas was introduced at a flow rate of 80 sccm, and $O_2$ gas and Ar gas serving as plasma gases were introduced at flow rates of 100 sccm and 200 sccm, respectively, so that an $SiO_2$ film serving as a precoat film was formed so as to have a thickness of 1.0 μm. This thin film deposition treatment was carried out for the wafer W, and the amount of particles was measured in the similar manner. These results are shown in FIG. 27.

Figure 27:
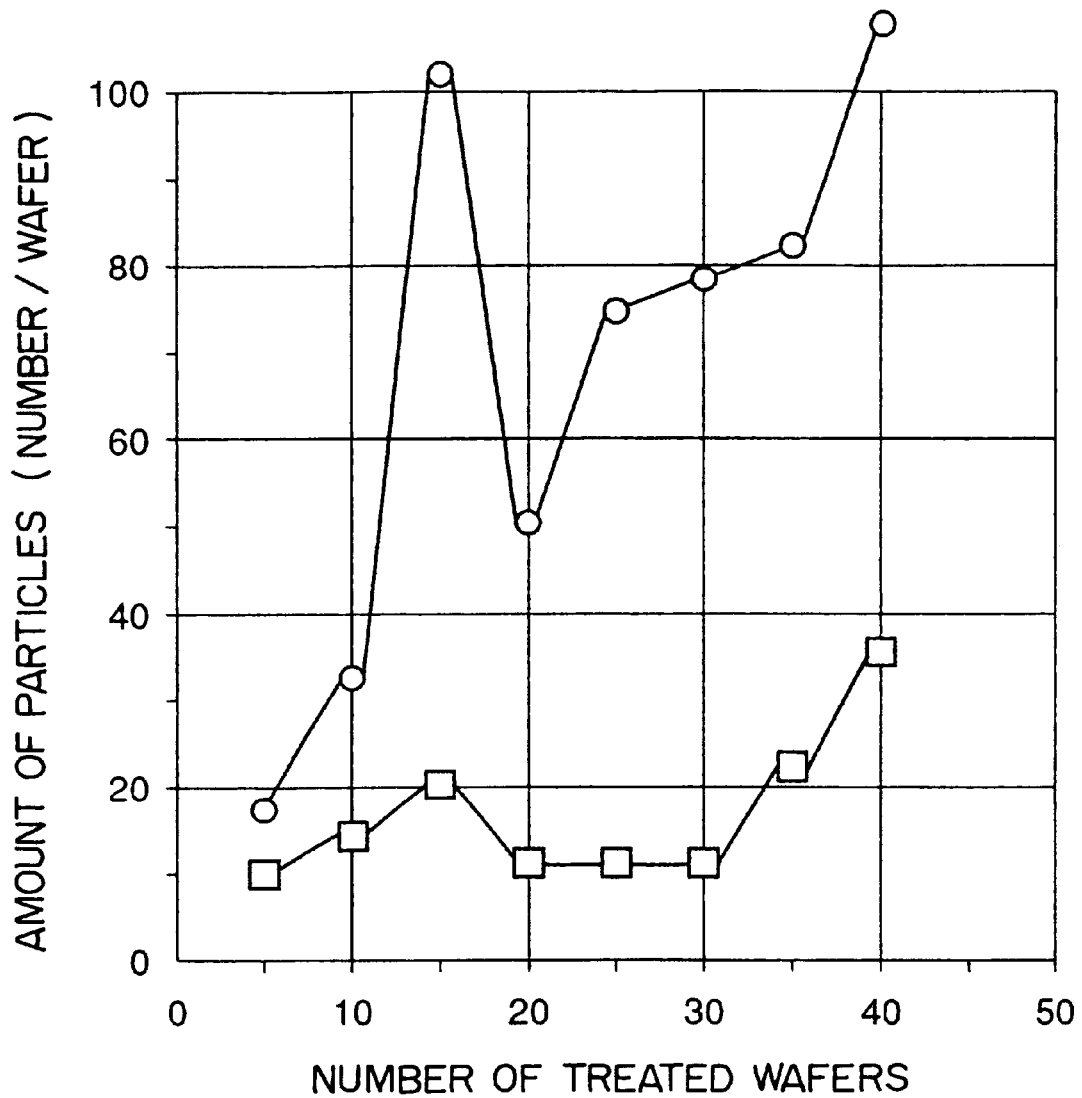
FIG. 27 is a characteristic diagram showing the relationship between the quantity of particles and the number of treated wafers for showing the results of an example of an experiment carried out for verifying the advantages of another preferred embodiment of the present invention.
Figure 28:
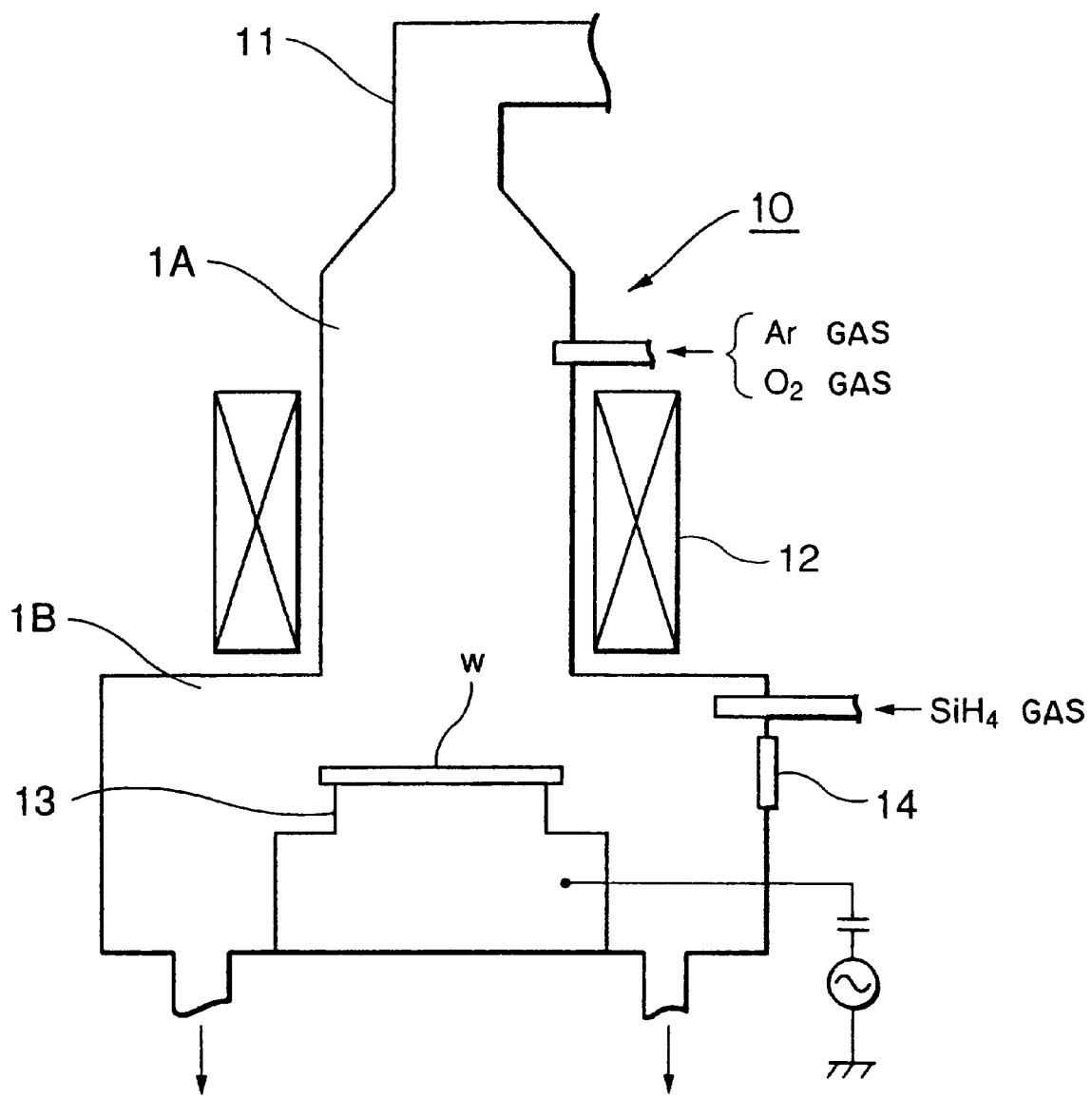
FIG. 28 is a sectional view of a conventional plasma treatment system.

In FIG. 27, the axis of abscissas denotes the number of treated wafers W. From these results, it can be seen that when the precoat film of a-C film is formed (shown by □ in the drawing), the amount of particles is far smaller than that in the case where a precoat film of $SiO_2$ film is formed (shown by ○ in the drawing). It is conceived that the reason for this is as follows. That is, when a precoat film of $SiO_2$ film is formed, the precoat film is easy to react with the thin film deposition gas as described above, so that the amount of particles increases on the basis of this reaction.

On the other hand, when a precoat film of a-C film is formed, the a-C film is difficult to react with the thin film deposition gas since it has a similar composition to that of the CF film deposited on the wafer W. Therefore, the production of particles based on the reaction of the precoat film with the thin film deposition gas is inhibited. In addition, the adhesion of the a-C film to the inner wall surface of the vacuum vessel 2 of aluminum is large. Consequently, the precoat film is difficult to be peeled from the inner wall surface of the vacuum vessel 2, and the film peel does not occur for a long time, so that the production of particles based on the film peel is inhibited. Therefore, it is suspected that when the precoat film is made of a-C film, it is possible to drastically decrease the production of particles.

Thus, according to this preferred embodiment, the production of particles in the vacuum vessel 2 can be drastically reduced, so that a stable treatment on a substrate to be treated can be carried out in the subsequent thin film deposition process.

According to the present invention, it is possible to reduce particles in a vacuum vessel, and it is possible to carry out a stable plasma treatment on a substrate to be treated.

What is claimed is:

1. A method for cleaning a plasma treatment system by removing a fluorine containing carbon film adhering to a vacuum chamber of said plasma treatment system during a plasma treatment in which said fluorine containing carbon film is deposed on a substrate, said method comprising the steps of:

introducing a cleaning gas into said vacuum chamber, said cleaning gas including oxygen and excluding fluorine;

producing a plasma by microwaves having a power density of 10 kW/m$^3$ or more to produce an active species of O from said oxygen; and removing said fluorine containing carbon film adhered to an inner wall portion of said vacuum chamber by said plasma.

2. A method for cleaning a plasma treatment system by removing a fluorine containing carbon film adhering to a vacuum chamber of said plasma treatment system during a plasma treatment in which said fluorine containing carbon film is deposed on a substrate, said method comprising the steps of:

introducing a cleaning gas into said vacuum chamber, said cleaning gas including oxygen and excluding fluorine;

producing a plasma by microwaves to produce an active species of O from said oxygen; and removing said flourine containing carbon film adhered to an inner wall portion of said vacuum chamber by said plasma, wherein pressure in said plasma treatment system is maintained at 0.2 Pa.

3. A method for cleaning a plasma treatment system by removing a fluorine containing carbon film adhering to a vacuum chamber of said plasma treatment system during a plasma treatment in which said fluorine containing carbon film is deposed on a substrate, said method comprising the steps of:

introducing a cleaning gas of CO gas or $N_2O_4$ gas into said vacuum chamber;

producing a plasma by microwaves to produce an active species of O from said CO gas or said $N_2O_4$ gas; and removing said fluorine containing carbon film adhered to an inner wall portion of said vacuum chamber by said plasma.

\* \* \* \* \*